(12) United States Patent
Eom

(10) Patent No.: US 12,148,334 B2
(45) Date of Patent: Nov. 19, 2024

(54) DISPLAY DEVICE INCLUDING CRACK DETECTION PATTERNS

(71) Applicant: Samsung Display Co., Ltd., Yongin-si (KR)

(72) Inventor: Cheolhwan Eom, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 17/893,039

(22) Filed: Aug. 22, 2022

(65) Prior Publication Data

US 2023/0206794 A1 Jun. 29, 2023

(30) Foreign Application Priority Data

Dec. 29, 2021 (KR) .................. 10-2021-0191813

(51) Int. Cl.
*G09G 3/00* (2006.01)
*H10K 59/131* (2023.01)
*H10K 59/40* (2023.01)

(52) U.S. Cl.
CPC ........... *G09G 3/006* (2013.01); *H10K 59/131* (2023.02); *H10K 59/40* (2023.02)

(58) Field of Classification Search
CPC ... G09G 2300/0413; G09G 2300/0426; G09G 2330/12; G09G 3/006; G09G 3/20; G09G 3/3208; H10K 59/131; H10K 59/40
See application file for complete search history.

(56) References Cited

U.S. PATENT DOCUMENTS

| | | | |
|---|---|---|---|
| 9,520,450 B2 | 12/2016 | Kim et al. | |
| 10,267,866 B2 * | 4/2019 | Lee | G01R 31/44 |
| 10,720,604 B2 | 7/2020 | Kim et al. | |
| 10,997,883 B2 | 5/2021 | Kang et al. | |
| 11,004,371 B2 | 5/2021 | Lee et al. | |
| 11,120,714 B2 * | 9/2021 | Lee | G02F 1/136259 |
| 11,217,133 B2 | 1/2022 | Bae et al. | |
| 11,263,936 B2 | 3/2022 | Lee et al. | |
| 11,282,420 B2 * | 3/2022 | Han | G06F 3/0443 |
| 11,361,690 B2 * | 6/2022 | Zhang | G09G 3/3291 |
| 11,507,151 B2 * | 11/2022 | Choi | G06F 1/189 |

FOREIGN PATENT DOCUMENTS

| | | |
|---|---|---|
| CN | 111258456 A | 6/2020 |
| CN | 113296639 A | 8/2021 |
| KR | 10-2016-0032791 A | 3/2016 |
| KR | 10-2018-0109390 A | 10/2018 |
| KR | 10-2019-0132774 A | 11/2019 |
| KR | 10-2020-0039896 A | 4/2020 |
| KR | 10-2020-0047941 A | 5/2020 |
| KR | 10-2020-0051099 A | 5/2020 |
| KR | 10-2020-0066415 A | 6/2020 |

* cited by examiner

*Primary Examiner* — Vinh P Nguyen

(74) *Attorney, Agent, or Firm* — Lewis Roca Rothgerber Christie LLP

(57) ABSTRACT

A display device includes: a plurality of pixels at a display area around a transmissive area; a first crack detection pattern at the transmissive area; a 2-1st crack detection pattern on the first crack detection pattern; and a 2-2nd crack detection pattern on the first crack detection pattern, the 2-2nd crack detection pattern being spaced from the 2-1st crack detection pattern, and adjacent to the 2-1st crack detection pattern. In a plan view, the first crack detection pattern overlaps with the 2-1st and 2-2nd crack detection patterns.

20 Claims, 19 Drawing Sheets

DISPLAY DEVICE INCLUDING CRACK DETECTION PATTERNS

CROSS-REFERENCE TO RELATED APPLICATIONS

This application claims priority to and the benefit of Korean Patent Application No. 10-2021-0191813, filed on Dec. 29, 2021, the entire content of which is incorporated by reference herein.

BACKGROUND

1. Field

Aspects of one or more embodiments of the present disclosure relate to a display device.

2. Description of the Related Art

In general, an electronic apparatus, such as a smartphone, a digital camera, a notebook computer, a navigation device, or a smart television, that provides an image to a user includes a display apparatus for displaying the image. The display device generates the image, and provides the generated image to the user through a display screen.

The display device includes a display panel for generating an image, an input detection part disposed on the display panel for detecting an external input, and functional elements for providing a user with various suitable functions. The display panel includes a plurality of pixels for generating the image. The input detection part includes a plurality of detecting electrodes for detecting the external input. The functional elements may include a camera, a sensor, and/or the like. The functional elements may be disposed in holes defined in the display panel and the input detection part.

The above information disclosed in this Background section is for enhancement of understanding of the background of the present disclosure, and therefore, it may contain information that does not constitute prior art.

SUMMARY

One or more embodiments of the present disclosure are directed to a display device capable of easily detecting a crack in a hole.

According to one or more embodiments of the present disclosure, a display device includes: a plurality of pixels at a display area around a transmissive area; a first crack detection pattern at the transmissive area; a 2-1st crack detection pattern on the first crack detection pattern; and a 2-2nd crack detection pattern on the first crack detection pattern, the 2-2nd crack detection pattern being spaced from the 2-1st crack detection pattern, and adjacent to the 2-1st crack detection pattern. In a plan view, the first crack detection pattern overlaps with the 2-1st and 2-2nd crack detection patterns.

In an embodiment, a hole in the transmissive area may be defined, in which a functional element may be located, and in a plan view, the first crack detection pattern may be defined as a closed curve surrounding the hole.

In an embodiment, in a plan view, the 2-1st and 2-2nd crack detection patterns may surround the hole.

In an embodiment, the plurality of pixels may include: a first pixel connected to the 2-1st crack detection pattern; and a second pixel connected to the 2-2nd crack detection pattern.

In an embodiment, the display device may further include: a first crack detection line configured to connect the first pixel and the 2-1st crack detection pattern to each other; a second crack detection line configured to connect the second pixel and the 2-2nd crack detection pattern to each other; and a first data line and a second data line connected to the first pixel and the second pixel, respectively.

In an embodiment, the display device may further include: a 1-1st switching element connected between the first crack detection line and the first data line, and configured to be switched by a first control signal; and a 1-2nd switching element connected between the second crack detection line and the second data line, and configured to be switched by the first control signal.

In an embodiment, the display device may further include: a data driver; and a plurality of second switching elements connected between the data driver and the first and second data lines, and configured to be switched by a second control signal.

In an embodiment, in a display mode, the 1-1st and 1-2nd switching elements may be configured to be turned off, and the second switching elements may be configured to be turned on.

In an embodiment, in a crack detection mode, the 1-1st and 1-2nd switching elements may be configured to be turned on, and the second switching elements may be configured to be turned off.

In an embodiment, in the crack detection mode, the first crack detection line may be configured to be applied with a detection voltage for turning off the first and second pixels.

In an embodiment, the detection voltage may be configured to be transmitted from the 2-1st crack detection pattern to the 2-2nd crack detection pattern by charge pumping of capacitors between the first crack detection pattern and the 2-1st and 2-2nd crack detection patterns.

In an embodiment, in an initialization mode before a crack detection mode, the 1-1st and 1-2nd switching elements and the second switching elements may be configured to be turned on.

In an embodiment, in the initialization mode, an initialization voltage may be configured to be applied to the 2-1st crack detection pattern through the first crack detection line, and the initialization voltage may be configured to be output from the data driver and applied to the 2-2nd crack detection pattern through the second crack detection line.

In an embodiment, the first crack detection pattern may include a plurality of first crack detection patterns.

In an embodiment, the display device may further include: a first conductive pattern on the pixels and around the transmissive area, the first conductive pattern including a plurality of sensing parts; and a second conductive pattern underneath the first conductive pattern, and configured to connect some sensing parts among the sensing parts to each other. Each of the 2-1st and 2-2nd crack detection patterns may be located at a same layer as that of the first conductive pattern.

In an embodiment, each of the 2-1st and 2-2nd crack detection patterns may be further located at a same layer as that of the second conductive pattern.

In an embodiment, the display device may further include: a first crack detection line connected to the 2-1st crack detection pattern; a second crack detection line connected to the 2-2nd crack detection pattern; a detection data line connected to a detection pixel from among the pixels; a first switching element connected between the second crack detection line and the detection data line, and configured to be switched by a first control signal; a data driver; and a second switching element connected between the data driver and the detection data line, and configured to be switched by a second control signal.

In an embodiment, in a crack detection mode, the first switching element may be configured to be turned on, the second switching element may be configured to be turned off, and a detection voltage may be configured to be applied to the detection pixel through the 2-1st and 2-2nd crack detection patterns.

In an embodiment, the display device may further include: a detection circuit configured to determine that a crack is generated in a hole in the transmissive area when the detection pixel displays a gradation larger than a reference gradation, the reference gradation being larger than a minimum gradation and smaller than a maximum gradation.

According to one or more embodiments of the present disclosure, a display device includes: a plurality of pixels at a display area around a transmissive area; a first crack detection pattern at the transmissive area; a 2-1st crack detection pattern on the first crack detection pattern; a 2-2nd crack detection pattern on the first crack detection pattern, the 2-2nd crack detection pattern being spaced from the 2-1st crack detection pattern, and adjacent to the 2-1st crack detection pattern; a first crack detection line at a non-display area around the display area, and connected to the 2-1st crack detection pattern; and a second crack detection line at the non-display area, and connected to the 2-2nd crack detection pattern.

BRIEF DESCRIPTION OF THE DRAWINGS

The above and other aspects and features of the present disclosure will be more clearly understood from the following detailed description of the illustrative, non-limiting embodiments with reference to the accompanying drawings. In the drawings.

DETAILED DESCRIPTION

Figure 1:
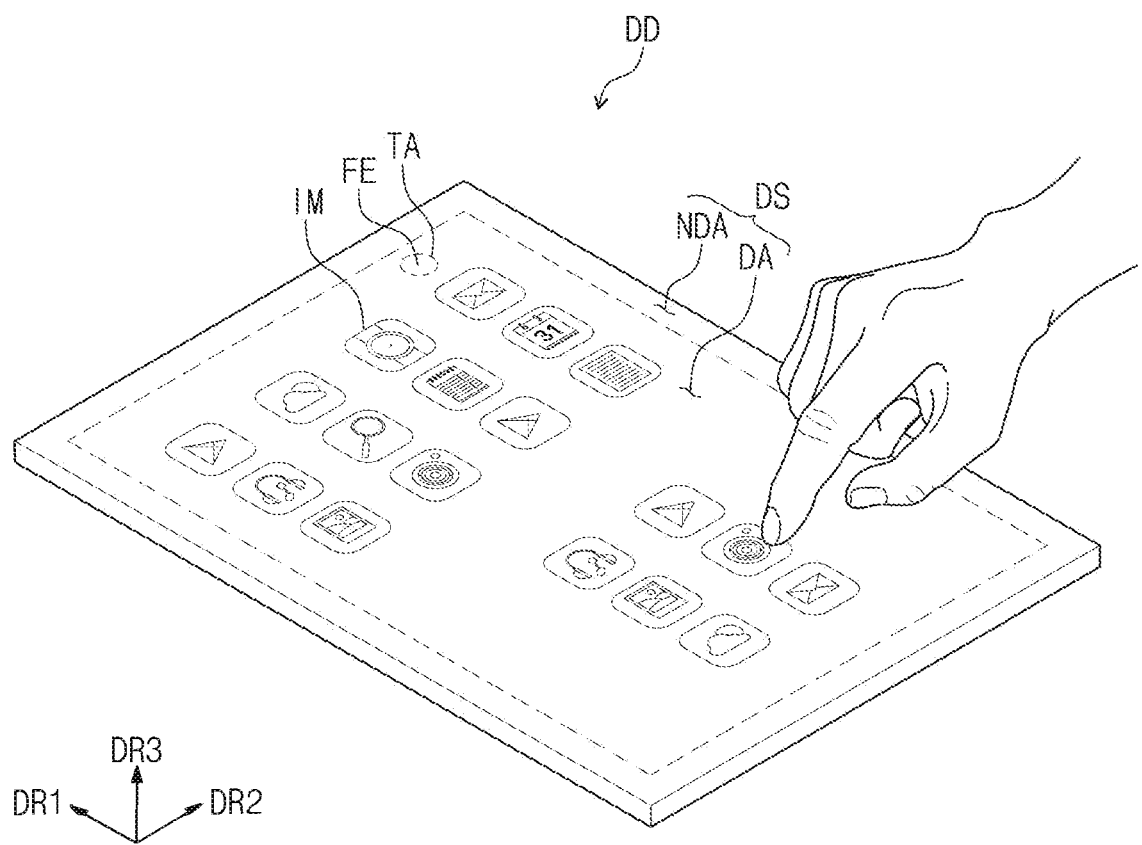
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to an embodiment of the present disclosure.

Referring to FIG. 1, the display device DD may have a rectangular shape having long sides extending in a first direction DR1, and short sides extending in a second direction DR2 crossing the first direction DR1. However, the present disclosure is not limited hereto, and the display device DD may have various suitable shapes, such as another suitable polygonal shape or a circular shape.

Hereinafter, a direction that vertically or substantially vertically crosses a plane defined by the first and second directions DR1 and DR2 is defined as a third direction DR3. In addition, as used in the present specification, the phrases "when viewed on a plane" and "in a plan view" are defined as a state viewed in (or from) the third direction DR3.

The top surface of the display device DD may be defined as a display surface DS, and have a plane defined by the first direction DR1 and the second direction DR2. Images IM generated in the display device DD may be provided to the user through the display surface DS.

The display surface DS may include a transmissive area TA, a display area DA around the transmissive area TA, and a non-display area NDA at (e.g., in or on) a periphery of the display area DA. The display area DA may surround (e.g., around a periphery of) the transmission area TA. The non-display area NDA may surround (e.g., around a periphery of) the display area DA, and may define a boundary of the display device DD, which is printed in a prescribed color. An image may be displayed at (e.g., in or on) the display area DA, but the image may not be displayed at (e.g., in or on) the non-display area NDA.

The transmissive area TA may be disposed with a functional element FE, such as a sensor or a camera. The transmittance of the transmissive area TA may be higher than that of the display area DA. Light may be provided to the functional element FE through the transmissive area TA. For example, the transmissive area TA may be disposed to abut an upper side and a right side of the display area DA, but the position of the transmissive area TA is not limited thereto.

The display device DD may be used in a large electronic device, such as a television, a monitor, an outdoor billboard, or the like. In addition, the display device DD may be used in a small or medium-sized electronic device, such as a personal computer, a notebook computer, a personal digital assistant, a vehicle navigator, a game console, a smartphone, a tablet, a camera, or the like. However, the present disclosure is not limited thereto, and the display device DD may be adopted in other suitable electronic devices without deviating from the spirit and scope of the present disclosure.

Figure 2:
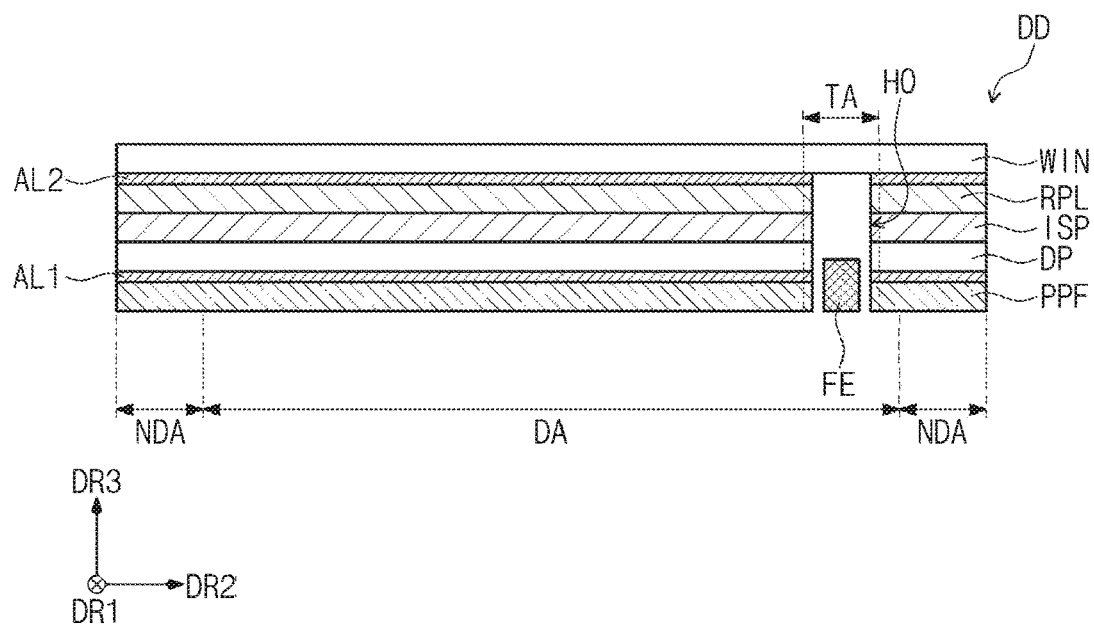
FIG. 2 illustrates an example cross section of the display device shown in FIG. 1.

FIG. 2 illustrates an example cross section of the display device shown in FIG. 1.

For example, FIG. 2 illustrates a cross section of the display device DD when viewed in the first direction DR1.

Referring to FIG. 2, the display device DD includes a display panel DP, an input sensing part (e.g., an input sensing layer or an input sensing panel) ISP, a reflection prevention layer RPL, a window WIN, a panel protection film PPF, and first and second adhesive layers AL1 to AL2.

The display panel DP may be a flexible display panel. The display panel DP according to an embodiment of the present disclosure may be an emissive display panel, but the present disclosure is not particularly limited thereto. For example, the display panel DP may be an organic light emitting display panel or an inorganic light emitting display panel. A light emitting layer of the organic light emitting display panel includes an organic light emitting material. A light emitting layer of the inorganic light emitting display panel may include a quantum dot, a quantum rod, and/or the like. Hereinafter, for convenience, the display panel DP will be described in the context of an organic light emitting display panel.

The input sensing part ISP may be disposed on the display panel DP. The input sensing part ISP may include a plurality of sensing parts (e.g., sensing electrodes) configured to sense an external input in an electrostatic capacitive type. When the display device DD is manufactured, the input sensing part ISP may be manufactured directly on the display panel DP. However, the present disclosure is not limited thereto, and the input sensing part ISP may be manufactured as a separate panel from the display panel DP, and bonded to the display panel DP by means of an adhesive layer.

The reflection prevention layer RPL may be disposed on the input sensing part ISP. When the display device DD is manufactured, the reflection prevention layer RPL may be manufactured directly on the input sensing part ISP. However, the present disclosure is not limited thereto, and the reflection prevention layer RPL may be manufactured as a separate panel from the display panel DP, and bonded to the input sensing layer ISP by means of an adhesive layer.

The reflection prevention layer RPL may be defined with an external light reflection preventing film. The reflection prevention layer RPL may reduce a reflection ratio of external light incident towards the display panel DP from above the display device DD.

When the external light proceeding towards the display panel DP is reflected by the display panel DP and provided to an external user, the user may visually recognize the external light. In order to prevent or substantially prevent such a phenomenon, the reflection prevention layer RPL may include, for example, a plurality of color filters that show the same color as those of the pixels of the display panel DP.

The color filters may filter the external light to output the same color as those of the pixels. In this case, the external light may not be visually recognized by the user. However, the present disclosure is not limited thereto, and the reflection prevention layer RPL may include a polarization film configured to reduce the reflectivity of external light. The polarization film may include a retarder and/or a polarizer.

The window WIN may be disposed on the reflection prevention layer RPL. The window WIN may protect the display panel DP, the input sensing part ISP, and the reflection prevention layer RPL from an external scratch or shock.

The panel protection film PPF may be disposed under (e.g., underneath) the display panel DP. The panel protection film PPF may protect the lower part of the display panel DP. The panel protection film PPF may include a flexible plastic material, such as polyethylene terephthalate (PET).

The first adhesive layer AL1 may be disposed between the display panel DP and the panel protection film PPF, and the display panel DP and the panel protection film PPF may be adhered to each other by means of the first adhesive layer AL1. The second adhesive layer AL2 may be disposed between the window WIN and the reflection prevention layer RPL, and the window WIN and the reflection prevention layer RPL may be adhered to each other by means of the second adhesive layer AL2.

A hole HO may be defined in the transmissive area TA. The hole HO may be defined in the panel protection film PPF, the display panel DP, the input sensing part ISP, the reflection protection layer RPL, and the first and second adhesive layers AL1 and AL2. The hole HO may be defined by removing parts (e.g., portions) from the panel protection film PPF, the display panel DP, the input sensing part ISP, the reflection protection layer RPL, and the first and second adhesive layers AL1 and AL2 that overlap with the transmissive area TA.

The hole HO is defined by removing parts (e.g., portions) from the panel protection film PPF, the display panel DP, the input sensing part ISP, the reflection protection layer RPL, and the first and second adhesive layers AL1 and AL2, and thus, the light transmittance of the transmissive area TA may be more enhanced than that of the display area DA. The functional element FE may be disposed in the hole HO.

Figure 3:
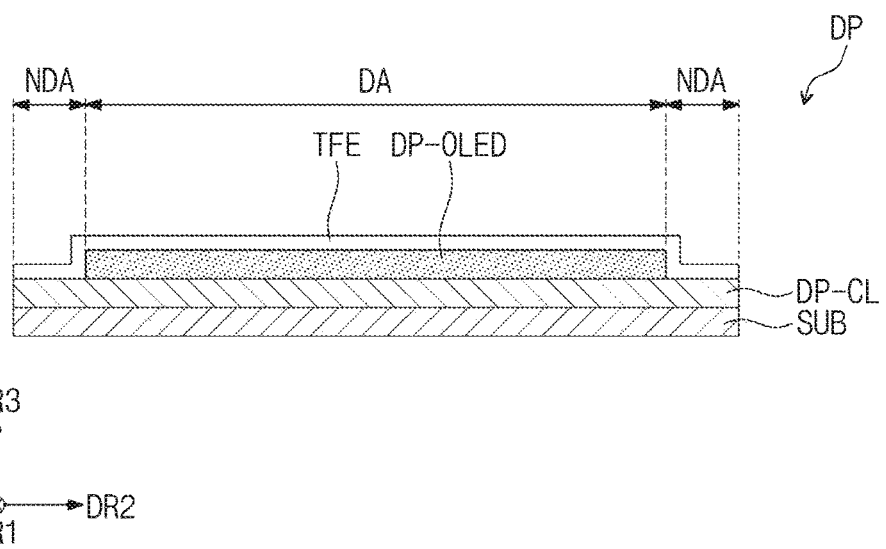
FIG. 3 illustrates an example cross section of a display panel shown in FIG. 2.

FIG. 3 illustrates an example cross section of the display panel shown in FIG. 2.

For example, FIG. 3 shows the cross section of the display panel DP when viewed in the first direction DR1.

Referring to FIG. 3, the display panel DP may include a substrate SUB, a circuit element layer DP-CL disposed on the substrate SUB, a display element layer DP-OLED disposed on the circuit element layer DL-CL, and a thin-film encapsulation layer TFE disposed on the display element layer DP-OLED.

The substrate SUB may include the display area DA, and the non-display area NDA around the display area DA. For example, the transmissive area TA and the hole HO are not shown in FIG. 3. The substrate SUB may include a flexible plastic material, such as glass or polyimide (PI). The display element layer DP-OLED may be disposed at (e.g., in or on) the display area DA.

A plurality of pixels may be disposed at (e.g., in or on) the circuit element layer DP-CL and the display element layer DP-OLED. Each of the pixels may include a transistor disposed in the circuit element layer DP-CL, and a light emitting element connected to the transistor and disposed in the display element layer DP-OLED. The configuration of the pixel will be described in more detail below.

The thin film encapsulation layer TFE may be disposed on the circuit element layer DP-CL to cover the display element layer DP-OLED. The thin film encapsulation layer TFE may protect the pixels from moisture, oxygen, and/or a foreign matter.

Figure 4:
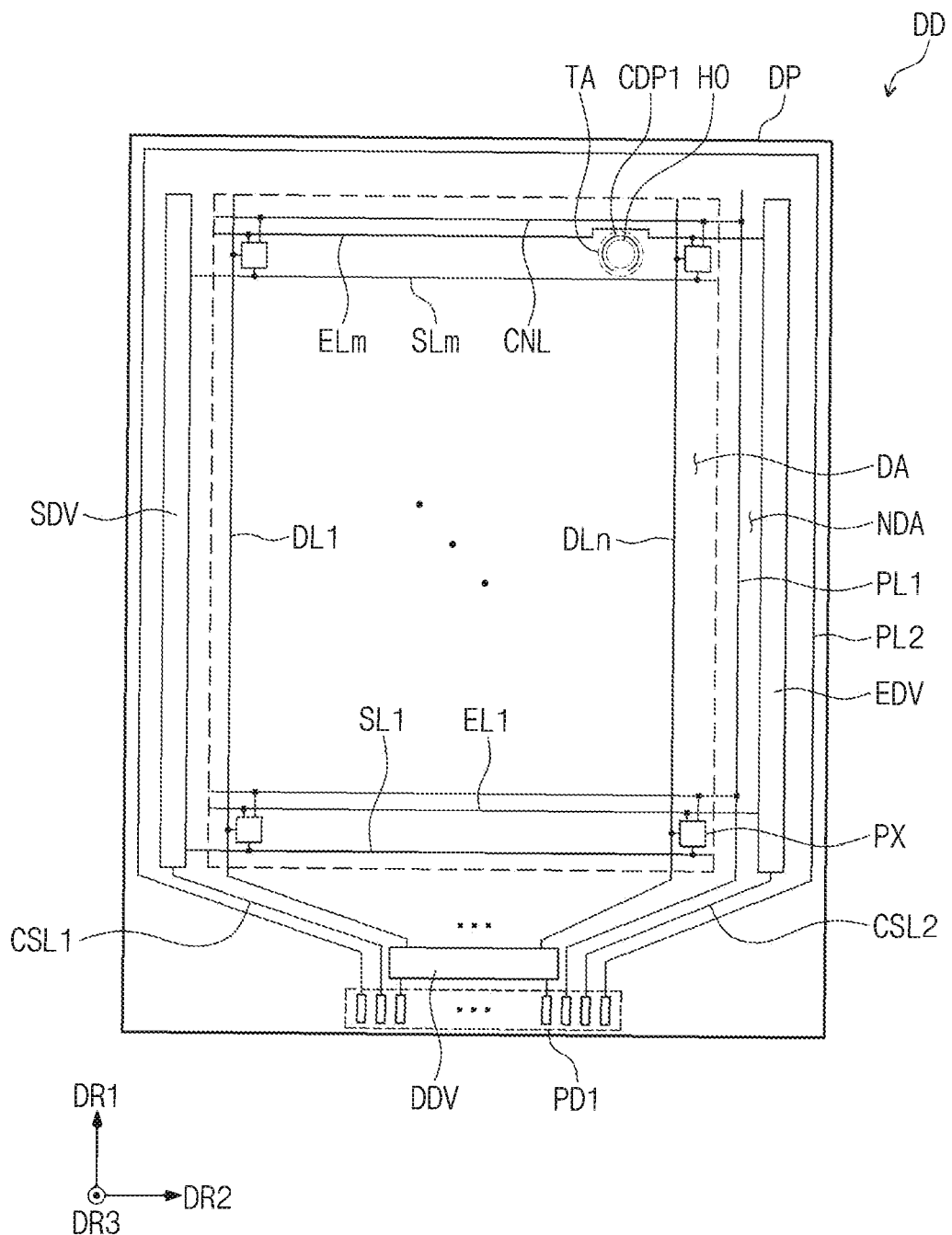
FIG. 4 is a plan view of the display panel shown in FIG. 2.

FIG. 4 is a plan view of the display panel shown in FIG. 2.

Referring to FIG. 4, the display device DD may include the display panel DP, a scan driver (SDV), a data driver (DDV), a light emission driver (EDV), and a plurality of first pads PD1.

The display panel DP may have a rectangular shape including long sides extending in the first direction DR1, and short sides extending in the second direction DR2, but the shape of the display panel DP is not limited thereto. The display panel DP may include a transmissive area TA, a display area DA surrounding (e.g., around a periphery of) the transmissive area TA, and a non-display area NDA surrounding (e.g., around a periphery of) the display area DA. The transmissive area TA, the display area DA, and the non-display area NDA may correspond to the transmissive area TA, the display area DA, and the non-display area NDA, respectively, shown in FIG. 1.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, connection lines CNL, and a first crack detection pattern CDP1. Here, m and n are natural numbers.

The pixels PX may be disposed at (e.g., in or on) the display area DA. The pixels PX may not be disposed at (e.g., in or on) the transmissive area TA and the non-display area NDA. The scan driver SDV and the light emission driver EDV may be disposed at (e.g., in or on) portions of the non-display area NDA adjacent to the long sides of the display panel DP, respectively. The data driver DDV may be disposed at (e.g., in or on) a portion of the non-display area NDA adjacent to any one of the short sides of the display panel DP. When viewed on a plane (e.g., in a plan view), the data driver DDV may be adjacent to a lower end of the display panel DP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The light emission lines EL1 to ELm may extend in the second direction DR2 to be connected to the pixels PX and the light emission driver EDV.

The light emission lines EL1 to ELm may extend by bypassing the transmissive area TA in order to not overlap with the transmissive area TA. The scan lines SL1 to SLm and the data lines DL1 to DLn may also extend by bypassing the transmissive area TA in order to not overlap with the transmissive area TA.

The first power line PL1 may extend in the first direction DR1 to be disposed at (e.g., in or on) the non-display area NDA. The first power line PL1 may be disposed between the display area DA and the light emission driver EDV, but the present disclosure is not limited thereto, and the first power line PL1 may be disposed between the display area DA and the scan driver SDV.

The connection lines CNL may extend in the second direction, and may be arranged along the first direction DR1 to be connected to the first power line PL1 and the pixels PX. A first voltage may be applied to the pixels PX through the first power line PL1 and the connection lines CNL that are connected to each other.

The second power line PL2 may be disposed at (e.g., in or on) the non-display area NDA, and may extend along the long sides of the display panel DP and another short side along which the data driver DDV is not disposed. The second power line PL2 may be disposed more outer than the scan driver SDV and the light emission driver EDV.

The second power line PL2 may extend towards the display area DA to be connected to the pixels PX. A second voltage having a lower level than that of the first voltage may be applied to the pixels PX through the second power line PL2.

The first control line CSL1 may be connected to the scan driver SDV, and may extend towards a lower end of the display panel DP. The second control line CSL2 may be connected to the emission driver EDV, and may extend to the lower end of the display area DP. The data driver DDV may be disposed between the first control line CSL1 and the second control line CSL2.

The first pads PD1 may be disposed at (e.g., in or on) the portion of the non-display area NDA adjacent to the lower end of the display panel DP, and may be more adjacent (e.g., may be closer) to the lower end of the display panel DP than the data driver DDV. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 configured to correspond to the data lines DL1 to DLn.

The first crack detection pattern CDP1 may be disposed at (e.g., in or on) the transmissive area TA. The first crack detection pattern CDP1 may be disposed to surround (e.g., around a periphery of) the hole HO defined in the transmission area TA. The first crack detection pattern CDP1 will be described in more detail below.

The display device DD may further include a timing controller configured to control the operations of the scan driver SDV, the data driver DDV, and the light emission driver EDV, and a voltage generation part (e.g., a voltage generator) configured to generate the first and second voltages. The timing controller and the voltage generation part may be connected to corresponding first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

The pixels PX may receive the data voltages in response to the scan signals. The pixels PX may display an image by emitting light having a brightness corresponding to the data voltages in response to the light emission signals.

Figure 5:
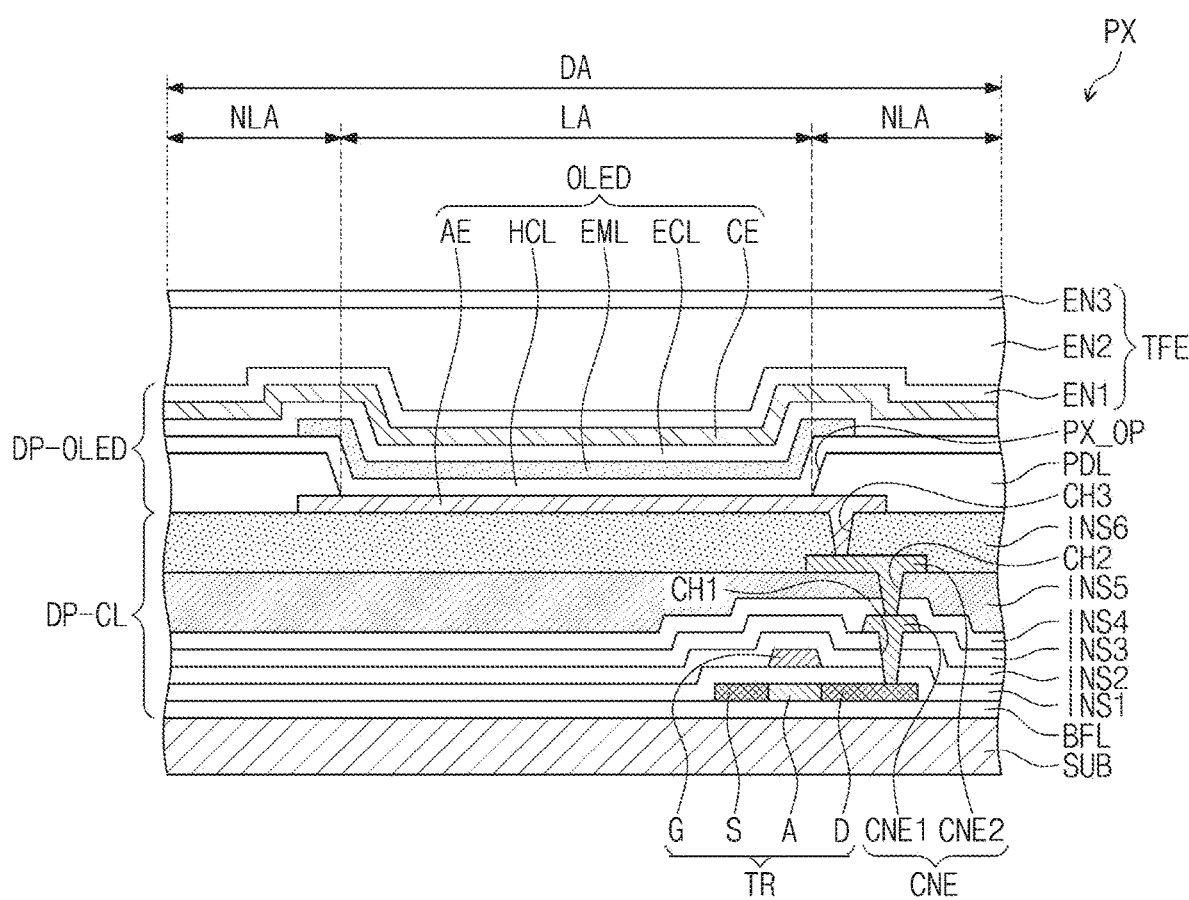
FIG. 5 illustrates an example cross section of a pixel shown in FIG. 4.

FIG. 5 illustrates an example cross section of a pixel shown in FIG. 4. The pixel PX shown in FIG. 5 may correspond to any one of the pixels PX shown in FIG. 4.

Referring to FIG. 5, the pixel PX may include a transistor TR and a light emitting element OLED. The light emitting element OLED may include a first electrode AE (e.g., an anode), a second electrode CE (e.g., a cathode), a hole control layer HCL, an electron control layer ECL, and a light emitting layer EML.

The transistor TR and the light emitting element OLED may be disposed on the substrate SUB. One example transistor TR is illustrated in FIG. 5, but the pixel PX may include a plurality of transistors configured to drive the light emitting element OLED, and at least one capacitor.

The display area DA may include a light emitting area LA, and non-light emitting areas NLA around the light emitting area LA that corresponds to each of the pixels PX. The light emitting element OLED may be disposed at (e.g., in or on) the light emitting area LA.

A buffer layer BFL may be disposed on the substrate SUB, and the buffer layer BFL may be an inorganic layer. A semiconductor pattern may be disposed on the buffer layer BFL. The semiconductor pattern may include polycrystalline silicon, amorphous silicon, or a metal-oxide semiconductor.

The semiconductor pattern may be doped with an N-type dopant or a P-type dopant. The semiconductor pattern may include a highly-doped area and a lowly-doped area. The conductivity of the highly-doped area may be greater than that of the lowly-doped area, and may correspond to or substantially play roles of the source and drain electrodes of the transistor TR. The lowly-doped area may correspond to or substantially correspond to an active area (e.g., a channel) of the transistor TR.

The source S1, the active area A1, and the drain D1 of the transistor TR may be provided from the semiconductor pattern. A first insulation layer INS1 may be disposed on the semiconductor pattern. The gate G of the transistor TR may be disposed on the first insulation layer INS1. A second insulation layer INS2 may be disposed on the gate G. A third insulation layer INS3 may be disposed on the second insulation layer INS2.

The connection electrode CNE may include a first connection electrode CNE1 and a second connection electrode CNE2 configured to connect the transistor TR and the light emitting diode OLED to each other. The first connection electrode CNE1 may be disposed on the third insulation layer INS3, and may be connected to the drain D through a first contact hole CH1 defined in the first to third insulation layers INS1 to INS3.

A fourth insulation layer INS4 may be disposed on the first connection electrode CNE1. A fifth insulation layer INS5 may be disposed on the fourth insulation layer INS4. The second connection electrode CNE2 may be disposed on the fifth insulation layer INS5. The second connection electrode CNE2 may be connected to the first connection electrode CNE1 through a second contact hole CH2 defined in the fourth and fifth insulation layers INS4 and INS5.

A sixth insulation layer INS6 may be disposed on the second connection electrode CNE2. The layers from the buffer layer BFL to the sixth insulation layer INS6 may be defined as the circuit element layer DP-CL. The first insulation layer INS1 to the sixth insulation layer INS6 may be inorganic layers or organic layers.

The first electrode AE may be disposed on the sixth insulation layer INS6. The first electrode AE may be connected to the second connection electrode CNE2 through a third contact hole CH3 defined in the sixth insulation layer INS6. A pixel definition layer PDL, in which an opening part PX_OP configured to expose a prescribed part of the first electrode AE is defined, may be disposed on the first electrode AE and the sixth insulation layer INS6.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in an area corresponding to the opening part PX_OP. The light emitting layer EML may include an organic material and/or inorganic material. The light emitting layer EML may generate light of one among red, green, and blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed at (e.g., in or on) the light emitting area LA and the non-light emitting area NLA.

The second electrode CE may be disposed on the electron control layer ECL. The second electrode CE may be commonly disposed for the pixels PX. The above described layers in which the light emitting element OLED may be defined may be defined as the display element layer DP-OLED.

The thin film encapsulation layer TFE may be disposed on the second electrode CE to cover the pixels PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulation layers, and may protect the pixels PX from moisture/oxygen. The second encapsulation layer EN2 may include an organic insulation layer, and may protect the pixels PX from a foreign matter such as a dust particle.

The first voltage may be applied to the first electrode AE1 through the transistor TR, and the second voltage may be applied to the second electrode CE. Holes and electrons injected to the light emitting layer EML may be combined to provide excitons, and the light emitting element OLED may emit light while the excitons are transitioned to a ground state.

Figure 6:
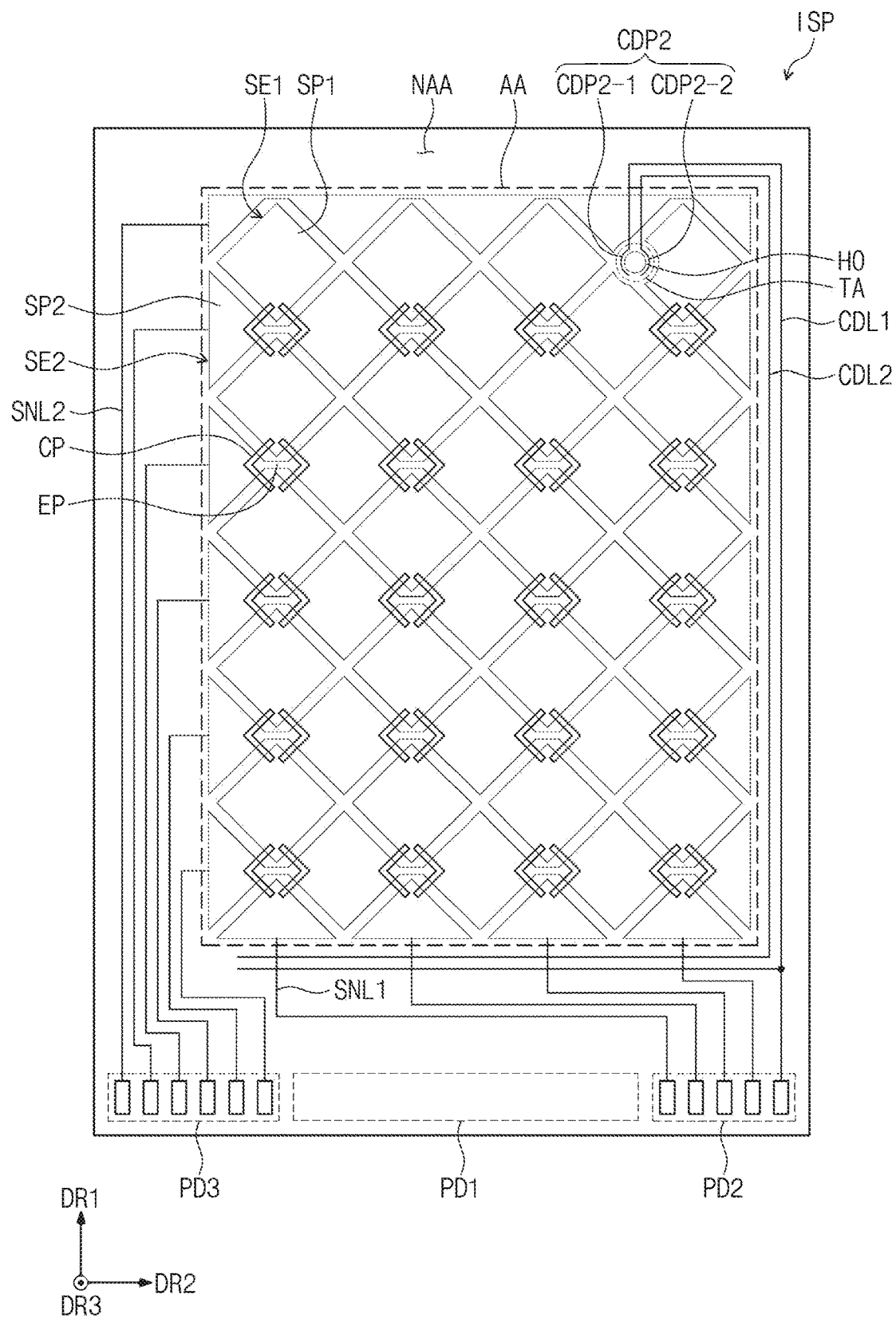
FIG. 6 is a plan view of an input sensing part illustrated in FIG. 2.

FIG. 6 is a plan view of the input sensing part illustrated in FIG. 2.

Referring to FIG. 6, the input sensing part ISP may include a plurality of sensing electrodes SE1 and SE2, a plurality of lines SNL1 and SNL2, a plurality of second and third pads PD2 and PD3, a second crack detection pattern CDP2, and first and second crack detection lines CDL1 and CDL2. The sensing electrodes SE1 and SE2, the lines SNL1 and SNL2, the second and third pads PD2 and PD3, the second crack detection pattern CDP2, and the first and second crack detection lines CDL1 and CDL2 may be disposed on the thin film encapsulation layer TFE.

A plane area of the input sensing part ISP may include the transmissive area TA, an active area AA around the transmissive area TA, and a non-active area NAA around the active area AA. The transmissive area TA may correspond to the transmissive area TA of the display area DA of the display panel DP. The active area AA may overlap with the display area DA, and the non-active area NAA may overlap with the non-display area NDA.

The sensing electrodes SE1 and SE2 may be disposed at (e.g., in or on) the active area AA, and the second and third pads PD2 and PD3 may be disposed at (e.g., in or on) the non-active area NAA. When viewed on a plane (e.g., in a plan view), the second pads PD2 and the third pads PD3 may be adjacent to a lower end of the input sensing part ISP. When viewed on a plane (e.g., in a plan view), the first pads PD1 may be disposed between the second pads PD2 and the third pads PD3.

The lines SNL1 and SNL2 may be connected to one ends of the sensing electrodes SE1 and SE2, and may extend to the non-active area NAA to be connected to the second and third pads PD2 and PD3. A sensing control part (e.g., a sensing controller) configured to control the input sensing part ISP may be connected to the second and third pads PD2 and PD3 through the printed circuit board.

The sensing electrodes SE1 and SE2 may include a plurality of first sensing electrodes SE1 that extend in the first direction DR1 to be disposed along the second direction DR2, and a plurality of second sensing electrodes SE1 that extend in the second direction DR2 to be disposed along the first direction DR1. The second sensing electrodes SE2 may extend to be insulated from and cross with the first sensing electrodes SE1.

The lines SNL1 and SNL2 may include a plurality of first signal lines SNL1 connected to the first sensing electrodes SE1, and a plurality of second signal lines SNL2 connected to the second sensing electrodes SE2. The first signal lines SNL1 may extend to the non-active area NAA to be connected to the second pads PD2. The second signal lines SNL2 may extend to the non-active area NAA to be connected to the third pads PD3.

For example, when viewed on a plane (e.g., in a plan view), the first signal lines SNL1 may be disposed at (e.g., in or on) a portion of the non-active area NAA adjacent to a lower side of the active area AA. In addition, when viewed on a plane (e.g., in a plan view), the second signal lines SNL2 may be disposed at (e.g., in or on) a portion of the non-active area NAA adjacent to the left side of the active area AA.

Each of the first sensing electrodes SE1 may include a plurality of first sensing parts SP1 disposed along the first direction DR1, and a plurality of connection patterns CP configured to connect the first sensing parts SP1 with each other. Each of the connection patterns CP may be disposed between two adjacent first sensing parts SP1 in the first direction DR1 to connect the two adjacent first sensing parts SP1 to each other.

Each of the second sensing electrodes SE2 may include a plurality of second sensing parts SP2 arranged along the second direction DR2, and a plurality of extension patterns EP configured to extend from the second sensing parts SP1. Each of the extension patterns EP may be disposed between two adjacent second sensing parts SP2 in the second direction DR2 to connect the two adjacent second sensing parts SP2 to each other.

The first sensing parts SP1 and the second sensing parts SP2 may not overlap with each other, and may be spaced apart from each other to be alternately disposed. The first sensing parts SP1 and the second sensing parts SP2 may be disposed on the pixels PX. The first sensing parts SP1 and the second sensing parts SP2 may provide a electrostatic capacitance. The extension patterns EP may not overlap with the connection patterns CP.

The second crack detection pattern CDP2 may be disposed at (e.g., in or on) the transmissive area TA. The first and second sensing parts SP1 and SP2 may be disposed at (e.g., in or on) the active area AA, but not at (e.g., in or on) the transmissive area TA. Accordingly, the first and second sensing parts SP1 and SP2 may be disposed around the second crack detection pattern CDP2.

The first and second crack detection lines CDL1 and CDL2 may be disposed at (e.g., in or on) the non-active NAA. For example, the first and second crack detection lines CDL1 and CDL2 may extend to a portion of the non-active area NAA adjacent to an upper side of the active area AA, and to a portion of the non-active area NAA adjacent to the right and lower sides of the active area AA.

The first crack detection line CDL1 may be connected to a corresponding second pad PD2 from among the second pads. The second pad PD2 connected to the first crack detection line CDL1 may be applied with a detection voltage described in more detail below. The first and second crack detection lines CDL1 and CDL2 may extend to the transmissive area TA to be connected to the second crack detection pattern CDP2.

The second crack detection pattern CDP2 may be disposed on the first crack detection pattern CDP1, and when viewed on a plane (e.g., in a plan view), overlaps with the first crack detection pattern CDP1. Hereinafter, such a configuration will be described in more detail.

The second crack detection pattern CDP2 may include a 2-1st crack detection pattern CDP2-1 connected to the first crack detection line CDL1, and a 2-2nd crack detection pattern CDP2-2 connected to the second crack detection line CDL2. The 2-1st crack detection pattern CDP2-1 and the 2-2nd crack detection pattern CDP2-2 may be spaced apart from each other. The 2-1st and 2-2nd crack detection patterns CDP2-1 and CDP2-2 may be disposed to surround (e.g., around a periphery of) the hole HO.

The 2-1st and 2-2nd crack detection patterns CDP2-1 and CDP2-2 may be connected to the pixels PX, and such a configuration will be described in more detail below.

Figure 7:
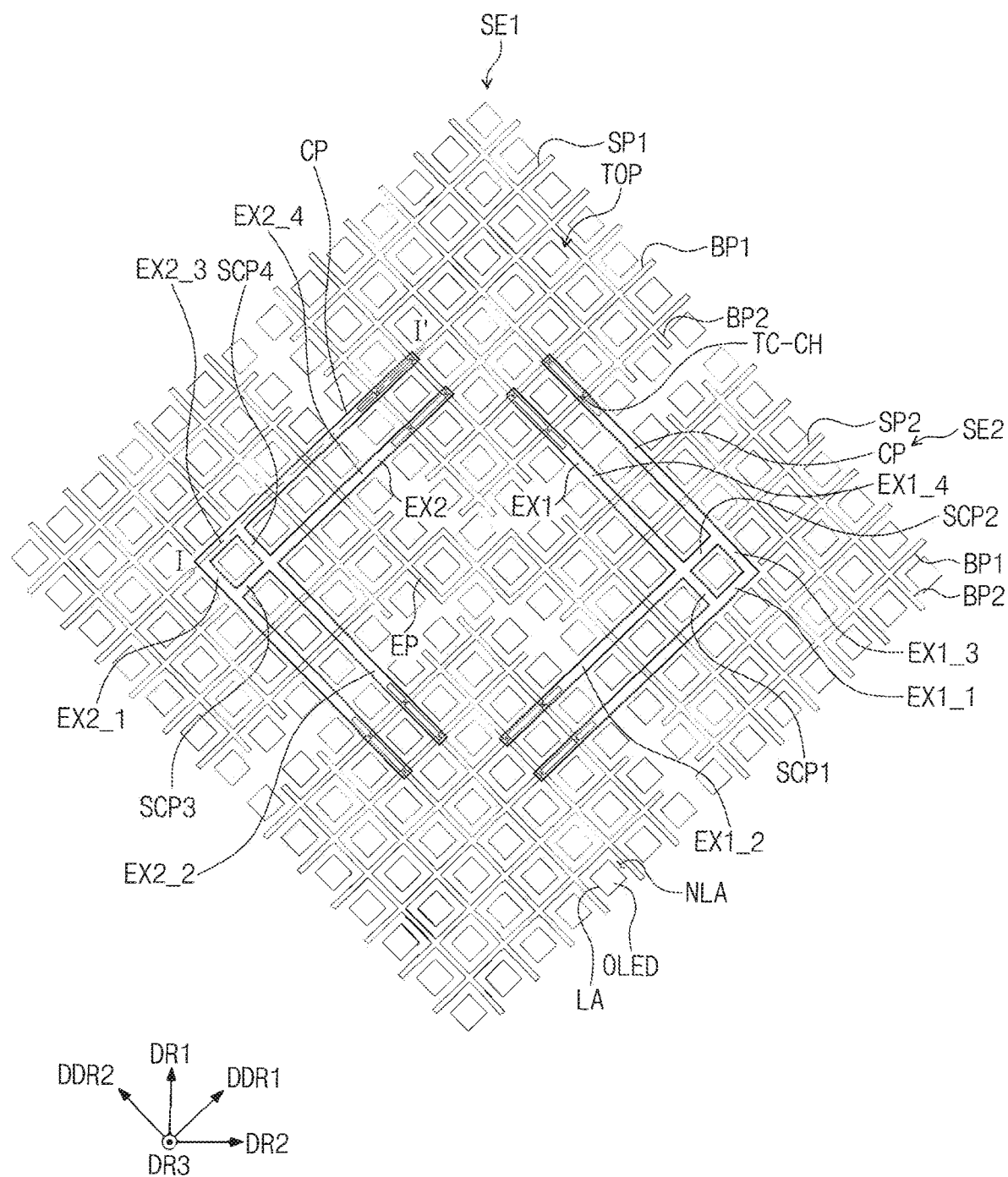
FIG. 7 is an enlarged view of two adjacent first sensing parts and two adjacent second sensing parts shown in FIG. 6.

FIG. 7 is an enlarged view of two adjacent first sensing parts and two adjacent second sensing parts shown in FIG. 6.

Referring to FIG. 7, the first sensing parts SP1 and the second sensing parts SP2 may have a mesh shape. In order to have the mesh shape, the first and second sensing parts SP1 and SP2 may include a plurality of first branch parts BP1 extending in a first diagonal direction DDR1, and a plurality of second branch parts BP2 extending in a second diagonal direction DDR2.

The first diagonal direction DDR1 may be defined as a direction intersecting with the first and second directions DR1 and DR2 on a plane defined by the first and second directions DR1 and DR2. The second diagonal direction DDR2 may be defined as a direction intersecting with the first diagonal direction DDR1 on the plane defined by the first and second directions DR1 and DR2. For example, the first direction DR1 may vertically intersect with the second direction DR2, and the first diagonal direction DDR1 may vertically intersect with the second diagonal direction DDR2.

The first branch parts BP1 of the first and second sensing parts SP1 and SP2 cross the second branch parts BP2 of the first and second sensing parts SP1 and SP2 to be integrally provided with each other. The first branch parts BP1 and the second branch parts BP2 may define touch opening parts TOP having a rhombus shape.

When viewed on a plane (e.g., in a plan view), the light emitting areas LA may be disposed in the touch opening parts TOP. The light emitting elements OLED may be disposed in the light emitting areas LA. Each of the light emitting areas LA may be the light emitting area LA shown in FIG. 5. The first and second sensing parts SP1 and SP2 may be disposed in the non-light emitting area NLA. Because the first and second sensing parts SP1 and SP2 are disposed in the non-light emitting area NLA, the light generated in the light emitting areas LA is normally output without being influenced by the first and second sensing parts SP1 and SP2.

The connection pattern CP may extend so as to not overlap with the extension pattern EP, to connect the first sensing parts SP1 to one another. The connection pattern CP may be connected to the first sensing parts SP1 through a plurality of contact holes TC-CH. The structure of the contact holes TC-CH will be described in more detail with reference to FIG. 8. The connection pattern CP may extend towards the first sensing parts SP1 via areas overlapping with the second sensing parts SP2.

The extension pattern EP may be disposed between the first sensing parts SP1, and may extend from the second sensing parts SP2. The second sensing parts SP2 and the extension pattern EP may be provided integrally with each other. The extension pattern EP may have a mesh shape. The extension pattern EP, the first sensing parts SP1, and the second sensing parts SP2 may be disposed at (e.g., in or on) the same layer as each other, and may be concurrently (e.g., simultaneously or substantially simultaneously) patterned and formed with the same material as each other.

The connection pattern CP may include a first extension part EX1, and a second extension part EX2 having a shape that is symmetrical or substantially symmetrical to that of the first extension part EX1. The extension pattern EP may be disposed between the first extension part EX1 and the second extension part EX2.

The first extension part EX1 may extend via an area overlapping with one among the second sensing parts SP2, and may be connected to the first sensing parts SP1. The second extension part EX2 may extend via an area overlapping with another one among the second sensing parts SP2, and may be connected to the first sensing parts SP1.

Hereinafter, the first sensing parts SP1 may be defined as upper and lower first sensing parts SP1 according to their relative disposed positions. In addition, the second sensing parts SP2 may be defined as left and right sensing parts SP2 according to their relative disposed positions.

Prescribed portions of the first and second extension parts EX1 and EX2, which are adjacent to one sides (e.g., one ends) of the first and second extension parts EX1 and EX2, may be connected to the lower first sensing part SP1 through the plurality of contact holes TC-CH. Prescribed portions of the first and second extension parts EX1 and EX2, which are adjacent to the other sides (e.g., the other ends) of the first and second extension parts EX1 and EX2, may be connected to the upper first sensing part SP1 through the plurality of contact holes TC-CH.

The first extension part EX1 may include a first sub-extension part EX1_1 and a second sub-extension part EX1_2 extending in the first diagonal direction DDR1, a third sub-extension part EX1_3 and a fourth sub-extension part EX1_4 extending in the second diagonal direction DDR2, a first sub-conductive pattern SCP1 extending in the second diagonal direction DDR2, and a second sub-conductive pattern SCP2 extending in the first diagonal direction DDR1.

Prescribed portions of the first and second sub-extension parts EX1_1 and EX1_2, which are adjacent to one sides (e.g., one ends) of the first and second sub-extension parts EX1_1 and EX1_2, may be connected to the lower first sensing part SP1 through the plurality of contact holes TC-CH. Prescribed portions of the third and fourth sub-extension parts EX1_3 and EX1_4, which are adjacent to one sides (e.g., one ends) of the third and fourth sub-extension parts EX1_3 and EX1_4, may be connected to the upper first sensing part SP1 through the plurality of contact holes TC-CH.

The other side of the first sub-extension part EX1_1 extends from the other side of the third sub-extension part EX1_3, and the other side of the second sub-extension part EX1_2 extends from the other side of the fourth sub-extension part EX1_4. The first sub-conductive pattern SCP1 may extend from the other side of the fourth sub-extension part EX1_4 in the second diagonal direction DDR2 to the first sub-extension part EX1_1. The second sub-conductive pattern SCP2 may extend from the other side of the second sub-extension part EX1_2 in the first diagonal direction DDR1 to the third sub-extension part EX1_3.

The first sub-extension part EX1_1, the second sub-extension part EX1_2, the third sub-extension part EX1_3, the fourth sub-extension part EX1_4, the first sub-conductive pattern SCP1, and the second sub-conductive pattern SCP2 may be provided integrally with each other.

The first and second sub-extension parts EX1_1 and EX1_2 may extend to cross the prescribed number of the second branch parts BP2, which are adjacent to the lower first sensing part SP1, among the second branch parts BP2 of the right second sensing part SP2. The first branch parts BP1 of the right second sensing part SP2 may not be disposed in a portion of an area overlapping with the first and second sub-extension parts EX1_1 and EX1_2 and the second sub-conductive pattern SCP2.

The third and fourth sub-extension parts EX1_3 and EX1_4 may extend to cross the prescribed number of the first branch parts BP1, which are adjacent to the upper first sensing part SP1, among the first branch parts BP1 of the right second sensing part SP2. The second branch parts BP2 of the right second sensing part SP2 may not be disposed in a portion of an area overlapping the third and fourth sub-extension parts EX1_3 and EX1_4 and the first sub-conductive pattern SCP1.

The second extension part EX2 may include a fifth sub-extension part EX2_1 and a sixth sub-extension part EX2_2 extending in the second diagonal direction DDR2, a seventh sub-extension part EX2_3 and an eighth sub-extension part EX2_4 extending in the first diagonal direction DDR1, a third sub-conductive pattern SCP3 extending in the first diagonal direction DDR1, and a fourth sub-conductive pattern SCP4 extending in the second diagonal direction DDR2.

The left second sensing part SP2 may have a symmetrical or substantially symmetrical structure as that of the right second sensing part SP2, and the second extension part EX2 may have a symmetrical or substantially symmetrical structure as that of the first extension part EX1. Accordingly, redundant description of the fifth to eighth sub-extension parts EX2_1 to EX2_4, and the third and fourth sub-conductive patterns SCP3 and SCP4 will not be repeated.

Figure 8:
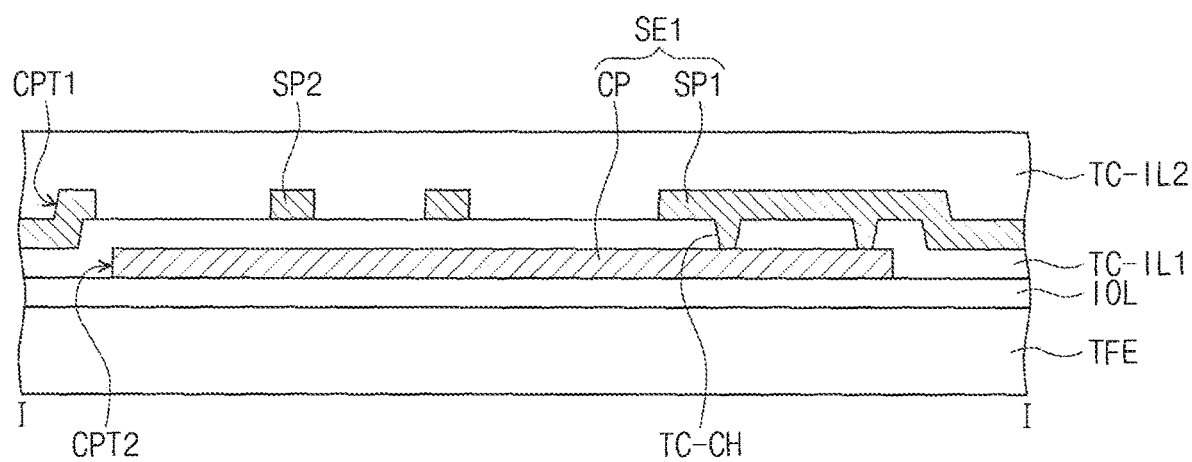
FIG. 8 is a cross-sectional view taken along the line I-I' shown in FIG. 7.

FIG. 8 is a cross-sectional view taken along the line I-I' shown in FIG. 7.

Referring to FIG. 8, an insulation layer IOL may be disposed on the thin film encapsulation layer TFE. The insulation layer IOL may include an inorganic material. At least one insulation layer IOL may be provided on the thin film encapsulation layer TFE. For example, two inorganic insulation layers IOL may be sequentially laminated on the thin film encapsulation layer TFE.

A connection pattern CP may be disposed on the insulation IOL. A first insulation layer TC-IL1 may be may be disposed on the connection pattern CP and the insulation layer IOL. The first insulation layer TC-IL1 may be disposed on the insulation layer IOL to cover the connection pattern CP. The first insulation layer TC-IL1 may include an inorganic insulation layer and an organic insulation layer.

The first sensing parts SP1 and the second sensing parts SP2 may be disposed on the first insulation layer TC-IL1. An extension pattern EP integrally provided with the second sensing parts SP2 may also be disposed on the first insulation layer TC-IL1. The connection pattern CP may be connected to the first sensing parts SP1 through the plurality of contact holes TC-CH defined in (e.g., penetrating) the first insulation layer TC-IL1.

The sensing parts SP1 and SP2 may be defined with the first conductive pattern CPT1. The first sensing parts and the second sensing parts SP1 and SP2 may be provided with the first conductive pattern CPT1. The connection pattern CP, which connects the first sensing parts SP1 to one another from among the first and second sensing parts SP1 and SP2, may be defined with the second conductive pattern CPT2.

A second insulation layer TC-IL2 may be disposed on the first and second sensing parts SP1 and SP2 and the first insulation layer TC-IL1. The second insulation layer TC-IL2 may be disposed on the first insulation layer TC-IL1 to cover the first and second sensing parts SP1 and SP2. The second insulation layer TC-IL2 may include an organic insulation layer.

Figure 9:
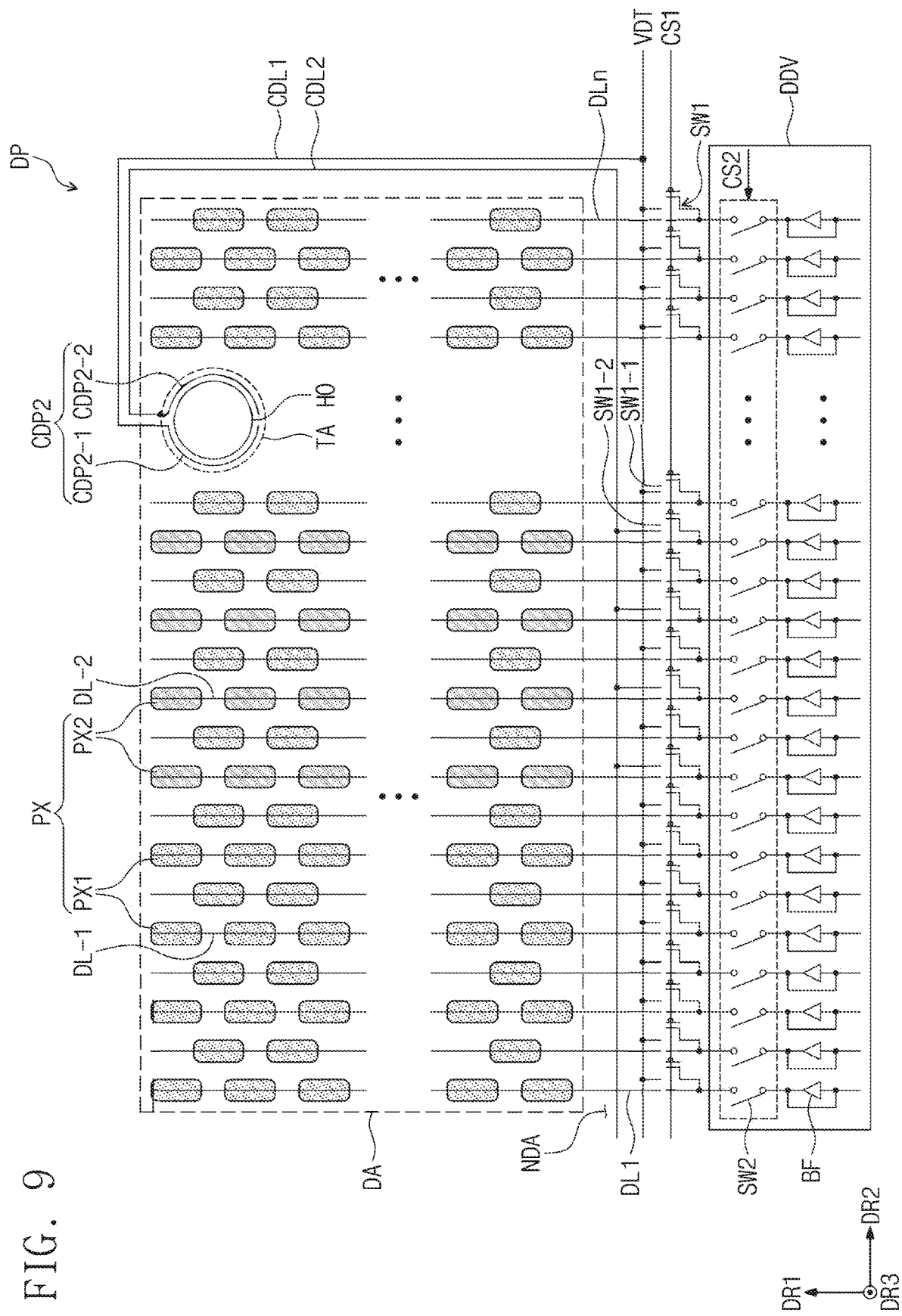
FIG. 9 is a plan view of the display panel, and shows a connection relationship between the pixels shown in FIG. 4, a second crack detection pattern, and first and second crack detection lines shown in FIG. 6.
Figure 10:
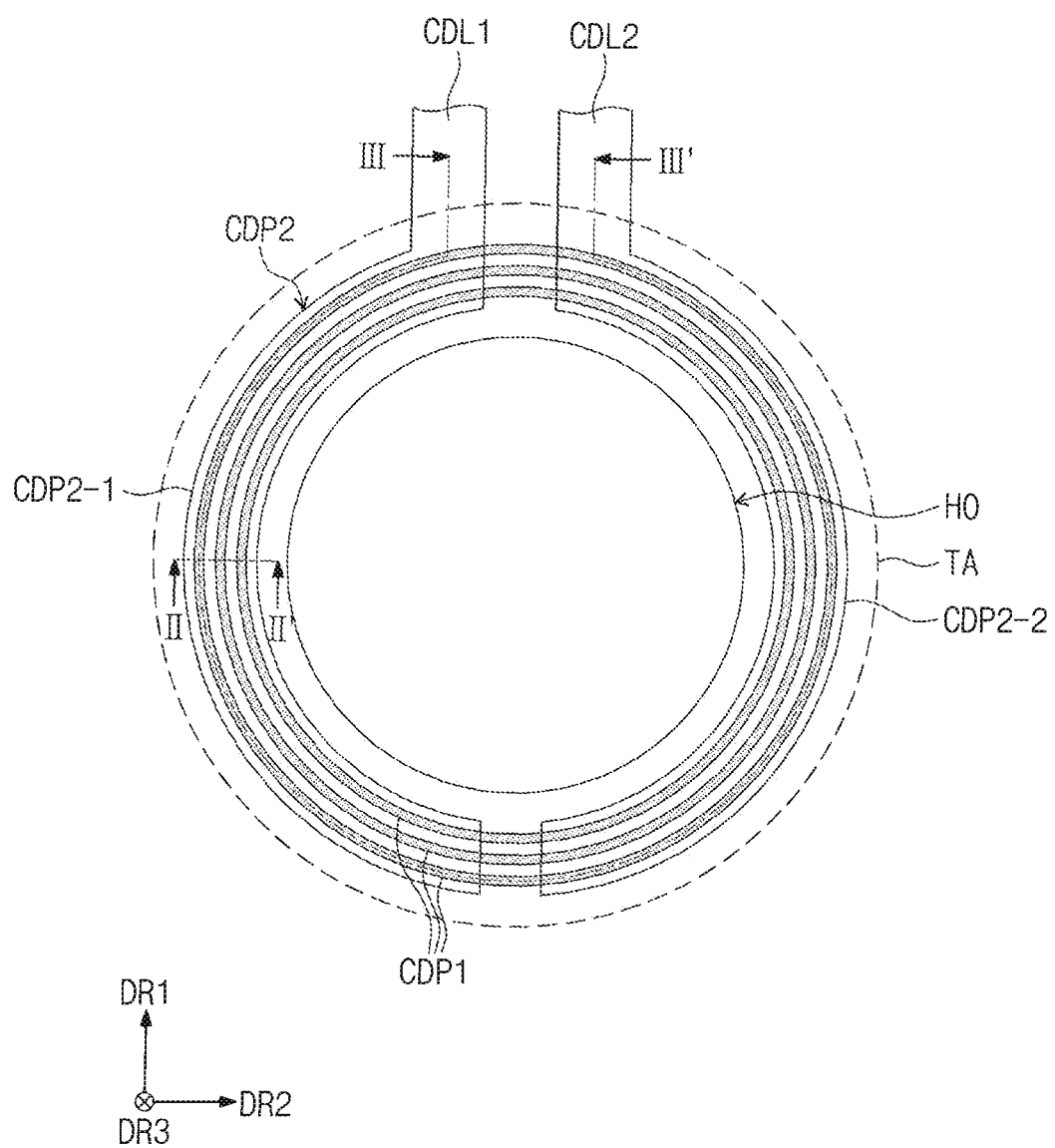
FIG. 10 is an enlarged view of a transmissive area shown in FIG. 9.

FIG. 9 is a plan view of a display panel, and shows a connection relationship between the pixels shown in FIG. 4, the second crack detection pattern, and first and second crack detection lines shown in FIG. 6. FIG. 10 is an enlarged view of the transmissive area shown in FIG. 9.

Referring to FIGS. 9 and 10, a first crack detection pattern CDP1 may be provided in plurality. The plurality of first crack detection patterns CDP1 and a second crack detection pattern CDP2 may be disposed at (e.g., in or on) the transmissive area TA. When viewed on a plane (e.g., in a plan view), the first crack detection patterns CDP1 may overlap with the second crack detection pattern CDP2. The first crack detection patterns CDP1 may be defined with a closed curve surrounding (e.g., around a periphery of) the hole HO defined in the transmissive area TA.

The first crack detection patterns CDP1 may be disposed under (e.g., underneath) the second crack detection pattern CDP2. For example, the first crack detection patterns CDP1 disposed under (e.g., underneath) and overlapping with the second crack detection pattern CDP2 are not shown in FIG. 9 for convenience of illustration, but are shown in a gray-colored pattern in FIG. 10. The first crack detection patterns CDP1 may have various suitable widths.

For example, three first crack detection patterns CDP1 are shown in FIG. 10, but the number of the first crack detection patterns CDP1 are not limited thereto. The configurations of the first crack detection patterns CDP1 may be the same or substantially the same as each other, and thus, for convenience of description, the configuration of any one first crack detection pattern CDP1 shown in FIG. 10 will be described in more detail as an example.

A 2-1st crack detection pattern CDP2-1 and a 2-2nd crack detection pattern CDP2-2 may be disposed at (e.g., in or on) the transmissive area TA. The 2-2nd crack detection pattern CDP-2-2 may be spaced apart from and disposed adjacent to the 2-1st crack detection pattern CDP2-1. The 2-1st and 2-2nd crack detection patterns CDP2-1 and CDP2-2 may have a curved shape surrounding (e.g., around a periphery of) the hole HO. When viewed on a plane (e.g., in a plan view), the first crack detection patterns CDP1 may overlap with the 2-1st and 2-2nd crack detection patterns CDP2-1 and CDP2-2.

The first crack detection line CDL1 may be disposed at (e.g., in or on) the non-display area NDA, and may extend towards the transmissive area TA to be connected to the 2-1st crack detection pattern CDP2-1. The second crack detection line CDL2 may be disposed at (e.g., in or on) the non-display area NDA, and may extend towards the transmissive area TA to be connected to the 2-2nd crack detection pattern CDP2-2.

Referring to FIG. 9, the pixels PX may be arrayed in the first direction DR1 and the second direction DR2. The first direction DR1 may correspond to an arrangement of rows, and the second direction DR2 may correspond to an arrangement of columns. The pixels disposed in an h-th column may be disposed to be alternately disposed with the pixels PX disposed in an (h+1)-th column.

The pixels PX may include a plurality of first pixels PX1 and a plurality of second pixels PX2. The data lines DL1 to DLn may include a plurality of first data lines DL-1 connected to the first pixels PX1, and a plurality of second data lines DL-2 connected to the second pixels PX2.

For example, in FIG. 9, one data line extending across the pixels disposed in the h-th column may be defined as being connected to the pixels PX disposed in the h-th column.

The first crack detection line CDL1 may connect the first pixels PX1 to the 2-1st crack detection pattern CDP2-1. Accordingly, the first pixels PX1 may be connected to the 2-1st crack detection pattern CDP2-1 through the first crack detection line CDL1. The first crack detection line CDL1 may be applied with a detection voltage VDT through the second pad PD2 described above.

The second crack detection line CDL2 may connect the second pixels PX2 to the 2-2nd crack detection pattern CDP2-2. Accordingly, the second pixels PX2 may be connected to the 2-2nd crack detection pattern CDP2-2 through the second crack detection line CDL2.

In more detail, the display panel DP may include a plurality of first switching elements SW1 configured to connect the first and second crack detection lines CDL1 and CDL2 and the first and second data lines DL-1 and DL-2 to one another. The first switching elements SW1 may be connected between the first and second crack detection lines CDL1 and CDL2 and the first and second data lines DL-1 and DL-2.

The first switching elements SW1 may be disposed at (e.g., in or on) the non-display area NDA. For example, the first switching elements SW1 may be disposed at (e.g., in or on) the non-display area NDA between the data driver DDV and the display area DA. Each of the first switching elements SW1 may include a PMOS transistor, but the present disclosure is not limited thereto, and each of the first switching elements SW1 may include an NMOS transistor.

The first switching elements SW1 may be switched in response to a first control signal CS1. In response to the first control signal CS1, the first switching elements SW1 may switch connections between the first and second crack detection lines CDL1 and CDL2 and the first and second data lines DL-1 and DL-2. When the first and second crack detection lines CDL1 and CDL2 and the first and second data lines DL-1 and DL-2 are connected to one another by the first switching elements SW1, the 2-1st and 2-2nd crack detection patterns CDP2-1 and CDP2-2 may be connected to the first and second pixels PX1 and PX2.

The first switching elements SW1 may include a plurality of 1-1st switching elements SW1-1 and a plurality of 1-2nd switching elements SW1-2. The 1-1st switching elements SW1-1 may be connected between the first crack detection line CDL1 and the first data lines DL-1, and may be switched by the first control signal CS1. The 1-2nd switching elements SW1-2 may be connected between the second crack detection line CDL2 and the second data lines DL-2, and may be switched by the first control signal CS1.

Each of the 1-1st switching elements SW1-1 may include a first electrode connected to the first crack detection line CDL1, a second electrode connected to a corresponding first data line DL-1 among the first data lines DL-1, and a control electrode configured to receive the first control signal CS1. Each of the 1-2nd switching elements SW1-2 may include a first electrode connected to the second crack detection line CDL2, a second electrode connected to a corresponding second data line DL-2 among the second data lines DL-2, and a control electrode configured to receive the first control signal CS1.

When the 1-1st switching elements SW1-1 are turned on by the first control signal CS1, the first crack detection line CDL1 is connected to the first data lines DL-1 to connect the 2-1st crack detection pattern CDP2-1 to the first pixels PX1. When the 1-2nd switching elements SW1-2 are turned on by the first control signal CS1, the second crack detection line CDL2 is connected to the second data lines DL-2 to connect the 2-2nd crack detection pattern CDP2-2 to the second pixels PX2.

The display panel DP may include a plurality of second switching elements SW2. The second switching elements SW2 may be connected between the data driver DDV and the first and second data lines DL-1 and DL-2 to be switched by a second control signal CS2. The second switching elements SW2 may be connected to the second electrodes of the 1-1st and 1-2nd switching elements SW1-1 and SW1-2. In response to the second control signal CS2, the second switching elements SW2 may switch connections between the data driver DDV and the first and second data lines DL-1 and DL-2.

The data driver DDV may include a plurality of output buffers BF configured to amplify and output the data voltages. The second switching elements SW2 may be connected to the output terminals of the output buffers BF.

The pixels PX may be driven in a display mode and a crack detection mode, and such operations will be described in more detail with reference to FIGS. 14 and 15 below.

Figure 11:
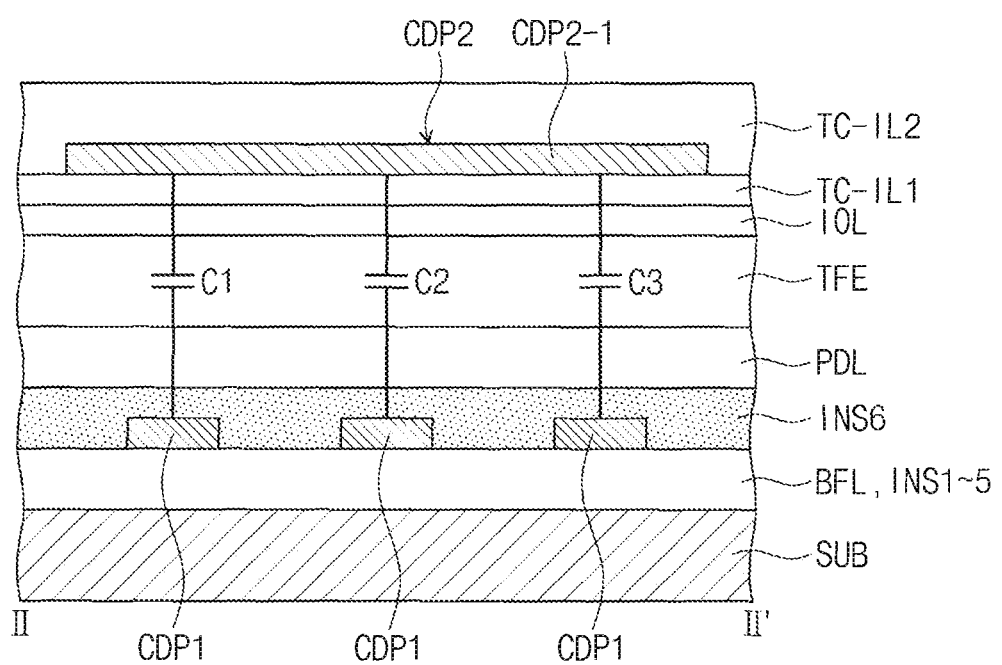
FIG. 11 is a cross-sectional view taken along the line II-II' illustrated in FIG. 10.
Figure 12:
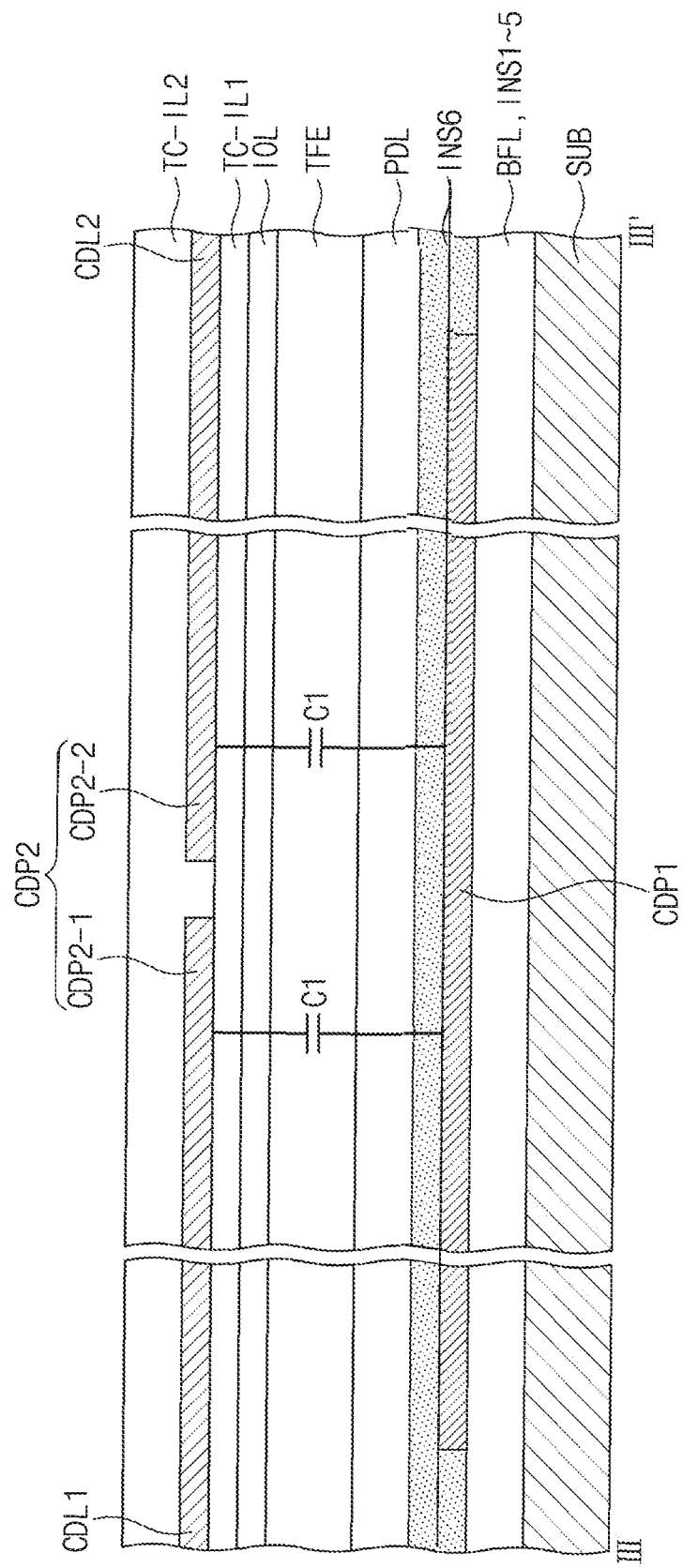
FIG. 12 is a cross-sectional view taken along the line III-III' shown in FIG. 10.

FIG. 11 is a cross-sectional view taken along the line II-II' illustrated in FIG. 10. FIG. 12 is a cross-sectional view taken along the line III-III' shown in FIG. 10.

For convenience of illustration, for example, the buffer layer BFL and the first to fifth insulation layers INS1 to INS5 in FIGS. 11 and 12 are shown as a single layer.

Referring to FIGS. 5, 10, and 11, the first crack detection patterns CDP1 may be disposed on the fifth insulation layer INS5. The sixth insulation layer INS6 may be disposed on the fifth insulation layer INS5 to cover the first crack detection patterns CDP1. The first crack detection patterns CDP1 may be disposed at (e.g., in or on) the same layer as that of the second connection electrode CNE2. The first crack detection patterns CDP1 may be patterned, and may be provided with the same material as that of the second connection electrode CNE2 shown in FIG. 5.

Referring to FIGS. 8, 10, and 11, the 2-1st crack detection pattern CDP2-1 may be disposed on the first crack detection patterns CDP1. The 2-2nd crack detection pattern CDP2-2 may also be disposed on the first crack detection patterns CDP1. The 2-1st crack detection pattern CDP2-1 may be disposed on the first insulation layer TC-IL1. The second insulation layer TC-IL2 may be disposed on the first insulation layer TC-IL1 to cover the 2-1st crack detection pattern CDP2-1.

The 2-1st crack detection pattern CDP2-1 may be disposed at (e.g., in or on) the same layer as that of the first conductive pattern CPT1 shown in FIG. 8. The 2-2nd crack detection pattern CDP2-2 may also be disposed at (e.g., in or on) the same layer as that of the conductive pattern CPT1 shown in FIG. 8. The 2-1st and 2-2nd crack detection patterns CDP2-1 and CDP2-2 may be concurrently (e.g., simultaneously or substantially simultaneously) patterned and may be provided with the same material as that of the first conductive pattern CPT1.

Capacitors C1 to C3 may be provided by the first crack detection patterns CDP1 and the 2-1st crack detection pattern CDP2-1 configured to overlap with each other. In the order from the outermost side to the innermost side, the first, second, and third capacitors C1, C2, and C3 may be provided by the first crack detection patterns CDP1.

The capacitors C1 to C3 may be also provided by the first crack detection patterns CDP1 and the 2-2nd crack detection pattern CDP2-2.

Referring to FIGS. 8, 10, and 12, the first crack detection line CDL1 is disposed at (e.g., in or on) the same layer as that of the 2-1st crack detection pattern CDP2-1 to be provided integrally with the 2-1st crack detection pattern CDP2-1. However, the present disclosure is not limited thereto, and the first crack detection line CDL1 may be disposed at (e.g., in or on) a different layer (e.g., a layer on which the second conductive pattern CPT2 is disposed) from that of the 2-1st crack detection pattern CDP2-1 to be connected to the 2-1st crack detection pattern CDP-2 through a contact hole defined in the first insulation layer TC-IL1.

The second crack detection line CDL2 is disposed at (e.g., in or on) the same layer as that of the 2-2nd crack detection pattern CDP2-2 to be provided integrally with the 2-2nd crack detection pattern CDP2-2. However, the present disclosure is not limited thereto, and the second crack detection line CDL2 may be disposed at (e.g., in or on) a different layer (e.g., the layer on which the second conductive pattern CPT2 is disposed) from that of the 2-2nd crack detection pattern CDP2-2 to be connected to the 2-2nd crack detection pattern CDP2-2 through a contact hole defined in the first insulation layer TC-IL1.

The capacitors C1 may be provided by the first crack detection pattern CDP1 and the 2-1st and 2-2nd crack detection patterns CDP2-1 and CDP2-2 configured to overlap with each other.

Figure 13:
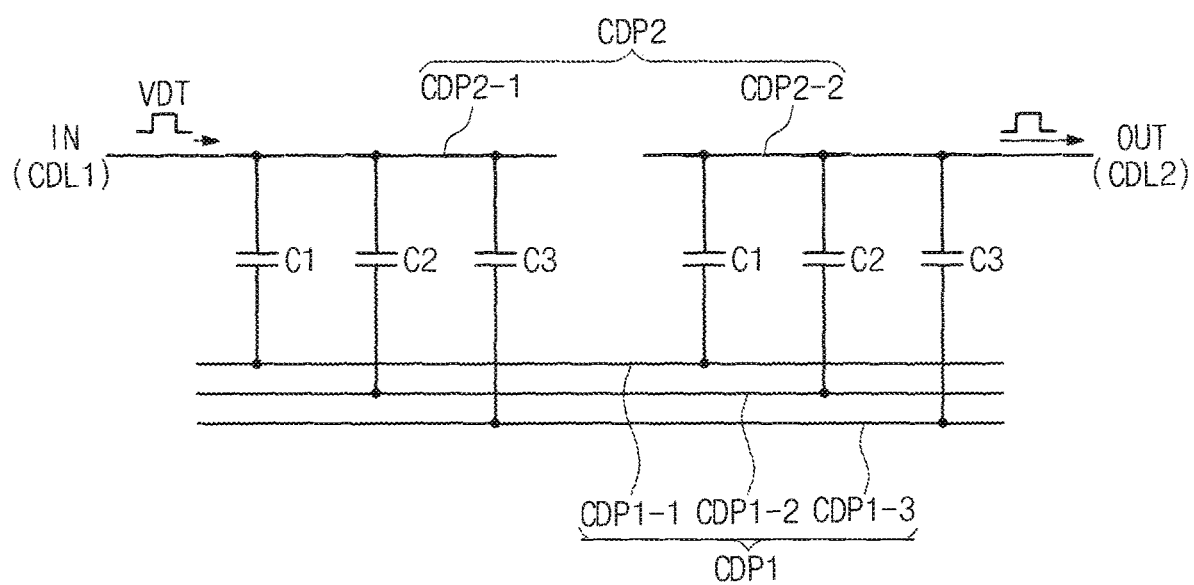
FIG. 13 illustrates example capacitors provided by first crack detection patterns and the second crack detection pattern illustrated in FIG. 10.

FIG. 13 illustrates example capacitors provided by the first crack detection patterns and the second crack detection pattern illustrated in FIG. 10.

Referring to FIGS. 10 and 13, a detection voltage VDT having a pulse type may be applied to the first crack detection line CDL1. Hereinafter, three first crack detection patterns CDP1 shown in FIG. 10 are defined as a 1-1st crack detection pattern CDP1-1, a 1-2nd crack detection pattern CDP1-2, and a 1-3rd crack detection pattern CDP1-3 in FIG. 13. The first crack detection line CDL1 may be defined as an input terminal IN, and the second crack detection line CDL2 may be defined as an output terminal OUT.

The first capacitors C1 may be provided by the 1-1st crack detection pattern CDP1-1 and the 2-1st and 2-2nd crack detection patterns CDP2-1 and CDP2-2. The second capacitors C2 may be provided by the 1-2nd crack detection pattern CDP1-2 and the 2-1st and 2-2nd crack detection patterns CDP2-1 and CDP2-2. The third capacitors C3 may be provided by the 1-3rd crack detection pattern CDP1-3 and the 2-1st and 2-2nd crack detection patterns CDP2-1 and CDP2-2.

The detection voltage VDT may be applied to the 2-1st crack detection pattern CDP2-1 through the first crack detection line CDL1. The 2-2nd crack detection pattern CDP2-2 is spaced apart from the 2-1st crack detection pattern CDP2-1, but the 1-1st, 1-2nd, and 1-3rd crack detection patterns CDP1-1, CDP1-2, and CDP1-3 may be continuously or substantially continuously disposed from below (e.g., underneath) the 2-1st crack detection pattern CDP2-1 to below (e.g., underneath) the 2-2nd crack detection pattern CDP2-2.

In such a structure, the detection voltage VDT may be transmitted from the 2-1st crack detection pattern CDP2-1 to the 2-2nd crack detection pattern CDP2-2 by a coupling phenomenon of the first, second, and third capacitors C1, C2, and C3. Such an operation may be defined as a charge pumping operation.

In other words, the detection voltage VDT may be transmitted from the 2-1st crack detection pattern CDP2-1 to the 2-2nd crack detection pattern CDP2-2 by the charge pumping operation of the capacitors C1, C2, and C3 provided by the first crack detection patterns CDP1 and the 2-1st and 2-2nd crack detection patterns CDP2-1 and CDP2-2. As a result, the detection voltage VDT may be applied to the second crack detection line CDL2 through the 2-2nd crack detection pattern CDP2-2.

Figure 14:
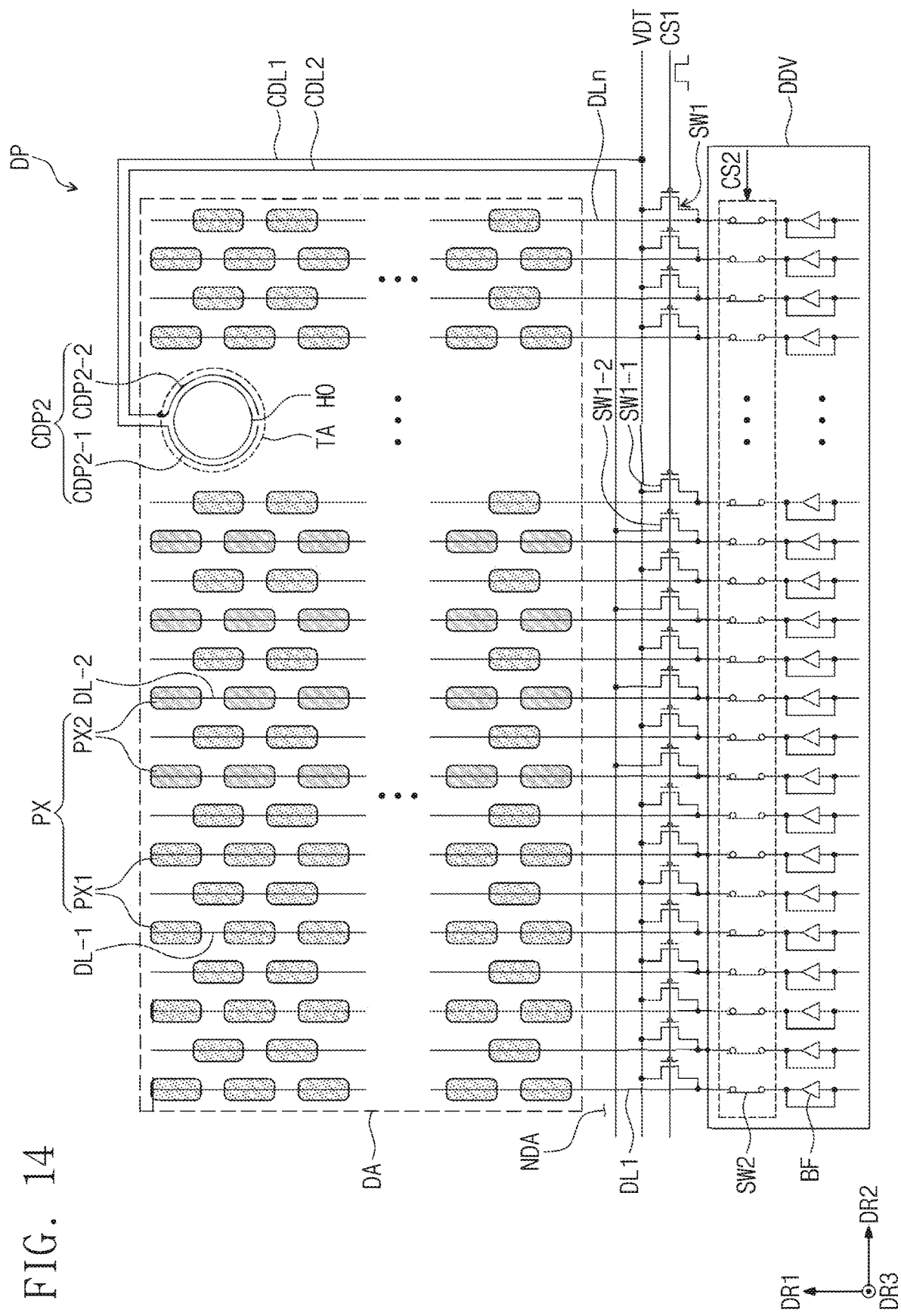
FIG. 14 illustrates a display mode operation of the pixels illustrated in FIG. 9.

FIG. 14 illustrates a display mode operation of the pixels illustrated in FIG. 9. FIG. 15 illustrates a crack detection mode of the pixels illustrated in FIG. 9.

Referring to FIGS. 9 and 14, in the display mode, the 1-1st and 1-2nd switching elements SW1-1 and SW1-2 may be turned off by the first control signal CS1. The second switching elements SW2 may be turned on by the second control signal CS2.

The data driver DDV may be connected to the data lines DL1 to DLn by the turned-on second switching elements SW2. The data voltages generated by the data driver DDV may be provided to the pixels PX through the data lines DL1 to DLn. As a result, the pixels PX may be driven to display an image.

Figure 15:
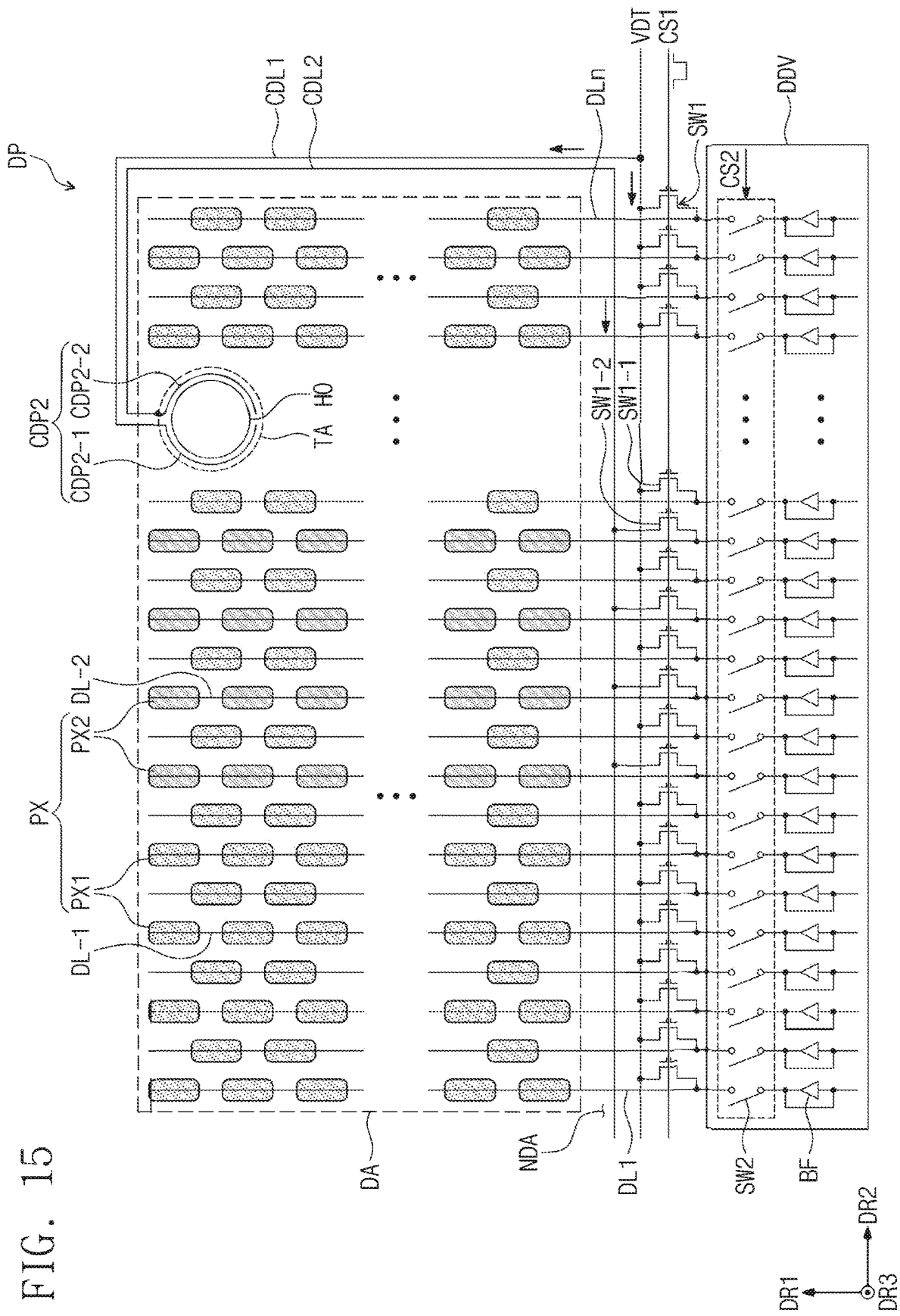
FIG. 15 illustrates a crack detection mode of the pixels illustrated in FIG. 9.

Referring to FIGS. 9, 10 and 15, in the crack detection mode, the 1-1st and 1-2nd switching elements SW1-1 and SW1-2 may be turned on by the first control signal CS1. The second switching elements SW2 may be turned off by the second control signal CS2.

The detection voltage VDT may be applied to the first crack detection line CDL1. The detection voltage VDT may be provided to the first pixels PX1 through the 1-1st switching elements SW1-1.

The detection voltage VDT may be applied to the 2-1st crack detection pattern CDP2-1 through the first crack detection line CDL1, and transmitted to the 2-2nd crack detection pattern CDP2-2 by the charge pumping operation described above. The detection voltage VDT may be provided to the second pixels PX2 through the 2-2nd crack detection pattern CDP2-2 and the second crack detection line CDL2.

The detection voltage VDT may have a voltage level for turning off the first and second pixels PX1 and PX2. For example, the transistor TR shown in FIG. 5 may be a PMOS transistor, and the detection voltage VDT may have a high voltage level for turning off the transistor TR. The first and second pixels PX1 and PX2 that are turned off by the detection voltage VDT may display black.

When the hole HO is provided, a crack may be provided in the first crack detection pattern CDP1 if the crack is generated in a portion in which the hole HO is provided in the display device DD. In this case, the detection voltage VDT may not be normally transmitted to the 2-2nd crack detection pattern CDP2-2. Accordingly, the voltage level of the 2-2nd crack detection pattern CDP2-2 may be low.

When the voltage level of the 2-2nd crack detection pattern CDP2-2 is low, the second pixels PX2 connected to the second crack detection line CDL2 may be turned on to emit light. Accordingly, a light emitting state of the second pixels PX2 may be easily visually recognized than that of the pixels PX1 displaying black.

As the second pixels PX2 emit light, the crack of the first crack detection patterns CDP1 may be detected, and as the crack of the first crack detection patterns CDP1 is detected, it may be determined that the crack is provided in the portion in which the hole HO is provided in the display device DD. Therefore, the crack may be easily detected according to the light emitting state of the second pixels PX2. The second pixels PX2 may be defined as detection pixels.

The first crack detection patterns CDP1 may not be used, but the 2-1st crack detection pattern CDP2-1 and the 2-2nd crack detection pattern CDP2-2 connected to each other may be used. Referring to FIG. 10, a lower end of the 2-1st crack detection pattern CDP2-1, which is not connected to the first crack detection line CDL1, may be connected to a lower end of the 2-2nd crack detection pattern CDP2-2, which is not connected to the second crack detection line CDL2. This second crack detection pattern CDP2 may be disposed only at (e.g., in or on) the input sensing part ISP.

There may occur a defect when the layers (e.g., the light emitting element and insulation layers) adjacent to the hole HO in the display panel DP are peeled off. Even though the layers adjacent to the hole HO in the display panel DP are peeled off, a crack may not be provided in the second crack detection pattern CDP2 disposed more upper than the position at which such a defect occurs. In other words, the defect of the hole HO may not be detected.

In an embodiment of the present disclosure, the first crack detection patterns CDP1 may be disposed in the display panel DP, and the detection voltage VDT may be applied to the second pixels PX2 through the first crack detection patterns CDP1 and the 2-1st and 2-2nd crack detection patterns CDP2-1 and CDP2-2. Accordingly, the defect provided in a portion adjacent to the hole HO in the display panel DP may be more easily detected.

Figure 16:
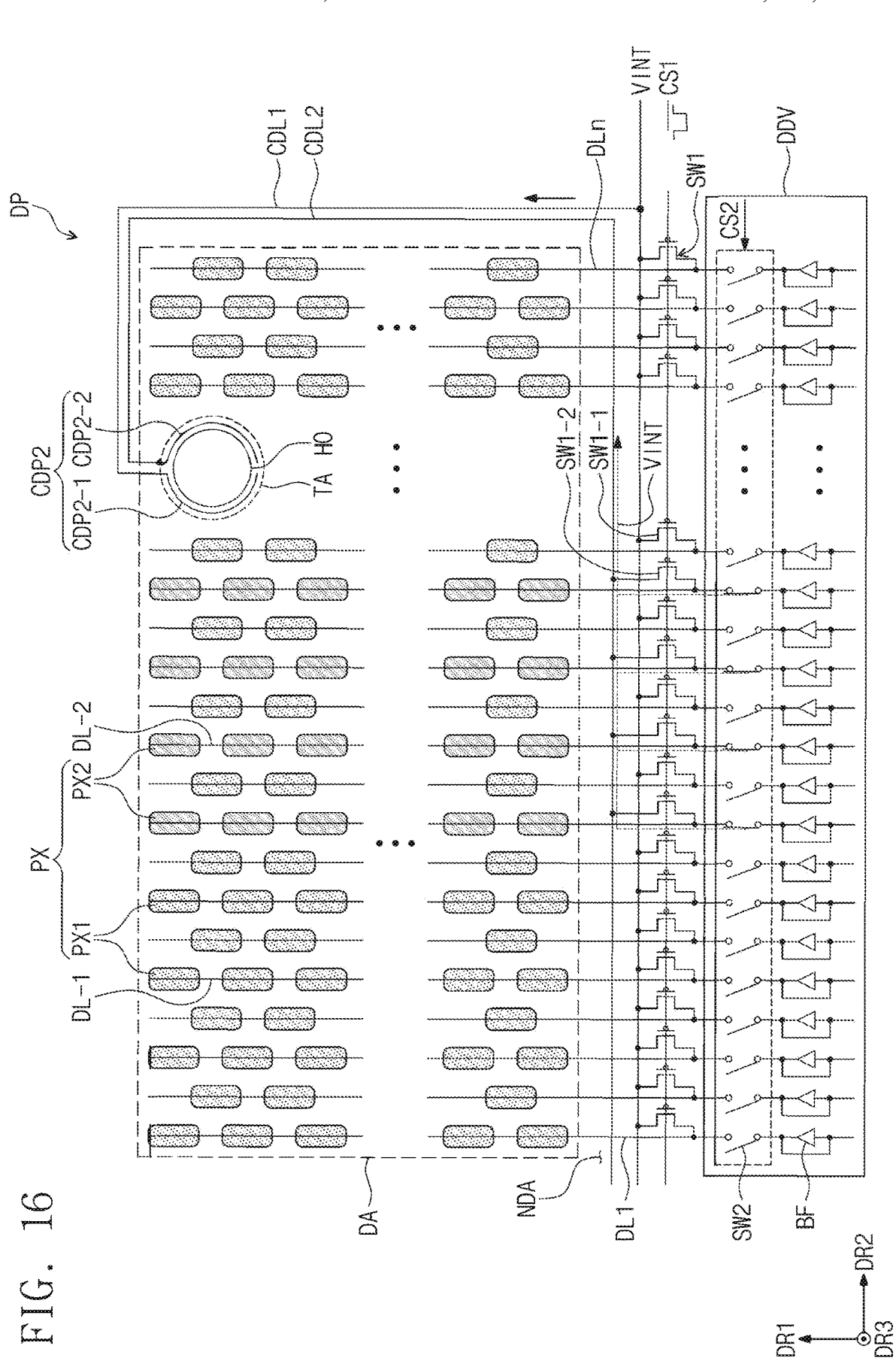
FIG. 16 illustrates initialization operations of 2-1st and 2-2nd crack detection patterns illustrated in FIGS. 9 and 10.
Figure 17:
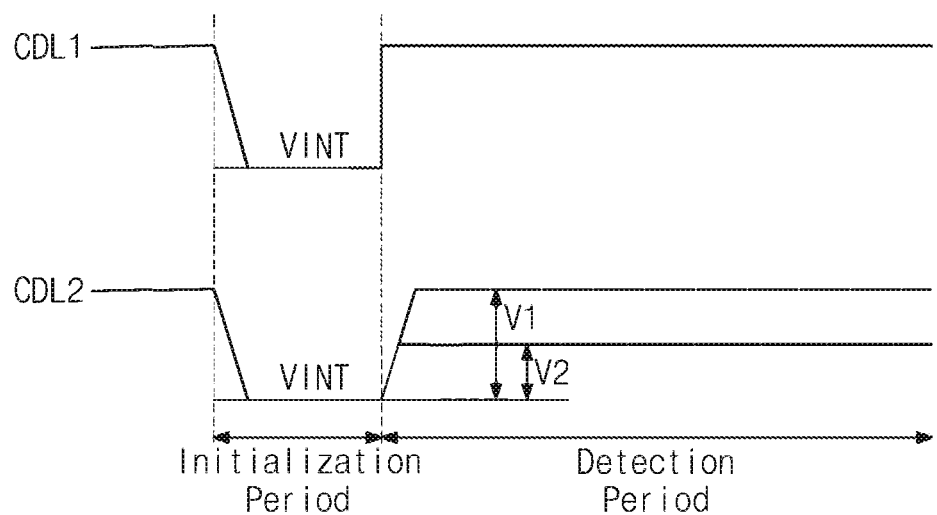
FIG. 17 is a timing drawing of signals for initializing the 2-1st and 2-2nd crack detection patterns illustrated in FIG. 16.

FIG. 16 illustrates initialization operations of the 2-1st and 2-2nd crack detection patterns illustrated in FIGS. 9 and 10. FIG. 17 is a timing diagram of signals for initializing the 2-1st and 2-2nd crack detection patterns illustrated in FIG. 16.

Referring to FIGS. 16 and 17, an initialization mode may be performed before the crack detection mode. In an initialization period, an initialization voltage VINT may be applied to the 2-1st and 2-2nd crack detection patterns CDP2-1 and CDP2-2. In more detail, in the initialization mode, the 1-1st and 1-2nd switching elements SW1-1 and SW1-2, and the second switching elements SW2 may be turned on.

The initialization voltage VINT may be applied to the first crack detection line CDL1. The initialization voltage VINT may be applied to the 2-1st crack detection pattern CDP2-1 through the first crack detection line CDL1. The 2-1st crack detection pattern CDP2-1-1 may be initialized by the initialization voltage VINT.

The data driver DDV may output the initialization voltage VINT. The initialization voltage VINT output from the data driver DDV may be applied to the 2-2nd crack detection pattern CDP2-2 through the turned-on 1-2nd switching elements SW1-2 and the second crack detection line CDL2. Accordingly, the 2-2nd crack detection pattern CDP2-2— may be initialized by the initialization voltage VINT.

In a crack detection period, when the second crack detection line CDL2 has a first voltage V1, it is determined as a normal state. In the crack detection period, when the second crack detection line CDL2 has a second voltage V2 lower than the first voltage V1, it is determined as a crack state. The second pixels PX2 may be turned on by the second voltage V2. The first and second voltages V1 and V2 may be defined as the voltages measured on the basis of the initialization voltage VINT.

Figure 18:
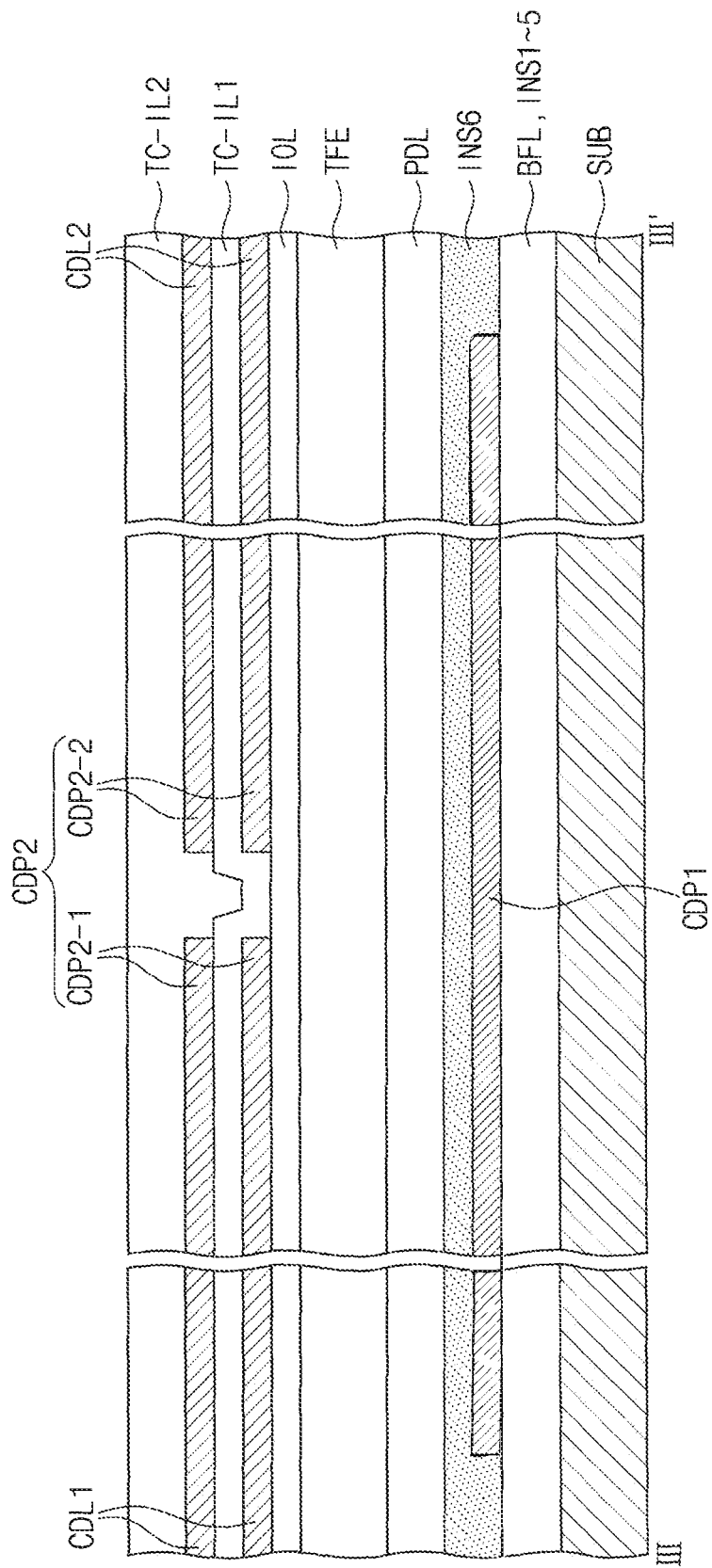
FIG. 18 illustrates a configuration of the second crack detection pattern according to another embodiment of the present disclosure.

FIG. 18 illustrates a configuration of the second crack detection pattern according to another embodiment of the present disclosure.

For example, FIG. 18 illustrates a cross section corresponding to FIG. 12.

Referring to FIG. 18, the 2-1st and 2-2nd crack detection patterns CDP2-1 and CDP2-2 may be further disposed at (e.g., in or on) the same layer as that of the second conductive pattern CPT2 as well as at (e.g., in or on) that of the first conductive pattern CPT1 shown in FIG. 8. In addition, the first and second crack detection lines CDL1 and CDL2 may also be further disposed at (e.g., in or on) the same layer as that of the second conductive pattern CPT2 as well as at (e.g., in or on) that of the first conductive pattern CPT1 shown in FIG. 8.

Figure 19:
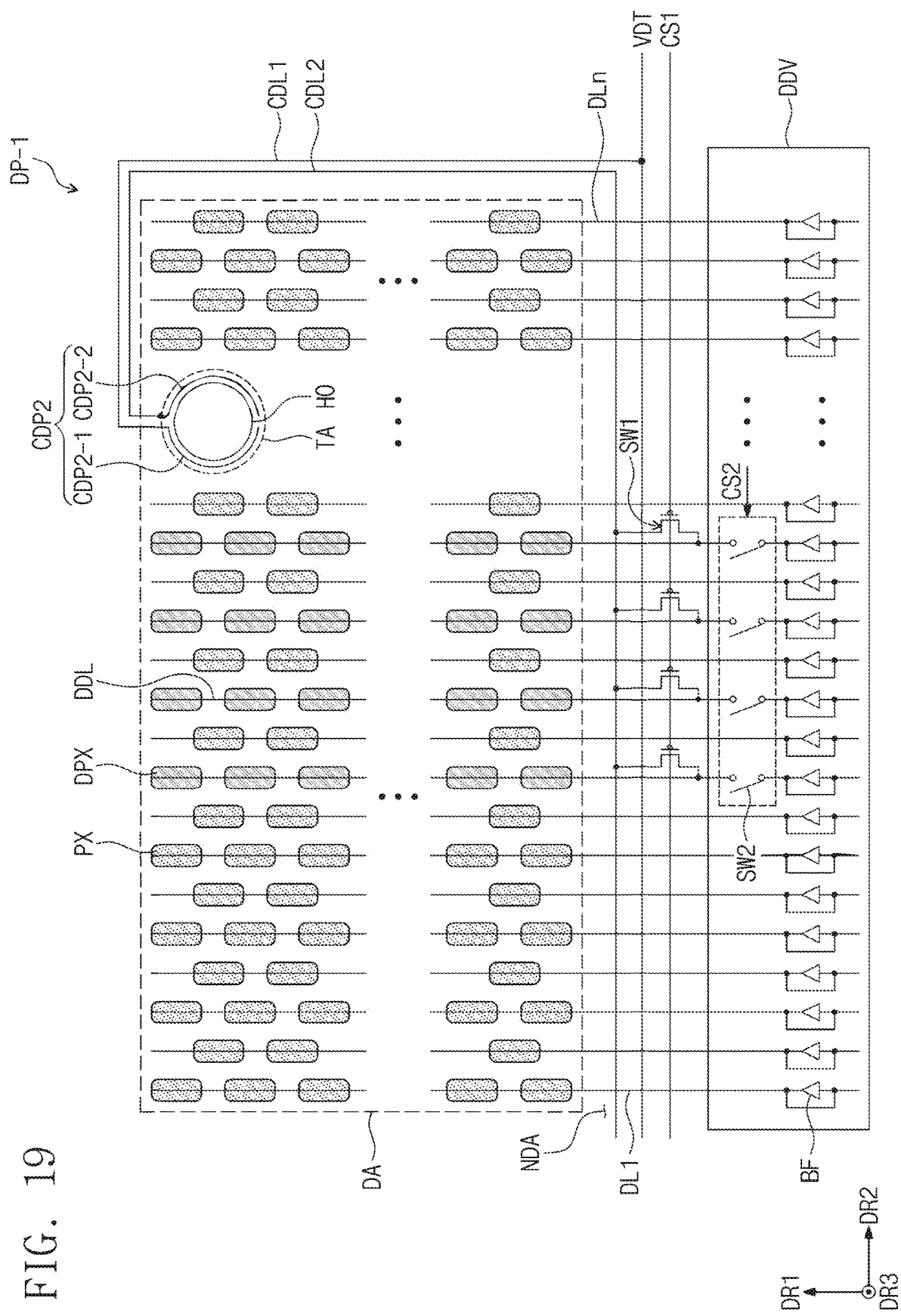
FIG. 19 illustrates a planar configuration of the display panel according to another embodiment of the present disclosure.
Figure 20:
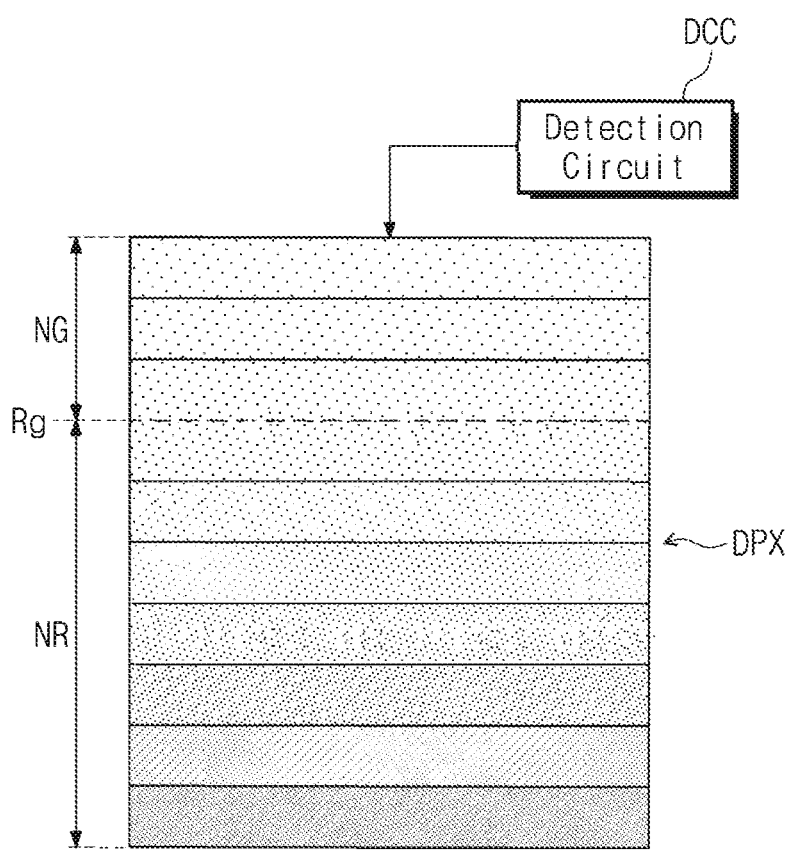
FIG. 20 illustrates a gradation displayable in detection pixels shown in FIG. 19, and a detection circuit configured to detect the gradations.

FIG. 19 illustrates a planar configuration of a display panel according to another embodiment of the present disclosure. FIG. 20 illustrates gradations displayable in the detection pixels shown in FIG. 19, and a detection circuit configured to detect the gradations.

For example, FIG. 19 illustrates a plan view corresponding to FIG. 9. Hereinafter, the configuration of the display panel DP-1 illustrated in FIG. 19 may be described on the basis of different components from those of the display panel DP illustrated in FIG. 9.

Referring to FIG. 19, the 2-1st crack detection pattern CDP2-1 may be connected to the first crack detection line CDL1, and the 2-2nd crack detection pattern CDP2-2 may be connected to the second crack detection line CDL2.

The pixels PX may include the detection pixels DPX, and the detection pixels DPX may be the second pixels PX2 described above. The detection pixels DPX may be connected to detection data lines DDL from among the data lines DL1 to DLn. The detection data lines DDL may be the second data lines DL-2 described above.

The first switching elements SW1 may be connected between the second crack detection line CDL2 and the detection data lines DDL to be switched by the first control signal CS1. The second switching elements SW2 may be connected between the data driver DDV and the detection data lines DDL to be switched by the second control signal CS2.

Other data lines different from the detection data lines DDL may be connected to other pixels PX different from the detection pixels DPX, and may not be connected to the first and second crack detection lines CDL1 and CDL2. The other data lines different from the detection data lines DDL may not be connected to the first and second switching elements SW1 and SW2.

In the display mode, the first switching elements SW1 may be turned off and the second switching elements SW2 may be turned on. In the crack detection mode, the first switching elements SW1 may be turned on and the second switching elements SW2 may be turned off.

As described above, the detection voltage VDT may be provided to the detection pixels DPX through the 2-1st and 2-2nd crack detection patterns CDP2-1 and CDP2-2.

Referring to FIGS. 10, 19, and 20, as a defect in the portion in which the hole HO is provided in the display device DD is larger, the defect of the first crack detection patterns CDP1 may be large. As the defect of the first crack detection patterns CDP1 is larger, the capacities of the capacitors C1, C2, and C3 may be reduced. When the capacities of the capacitors C1, C2, and C3 are reduced, the transmission ratio of the detection voltage VDT may be reduced. Accordingly, as the defect of the first crack detection patterns CDP1 are larger, the transmitted voltage level is lower, and thus, the detection pixels DPX may emit light with more gradations.

When the portion in which the hole HO is provided in the display device DD is defective, an operation of the display device DD may not be influenced in case of a small defect. When the defect is large, the display device DD may not operate normally. Such a defective state may be differentiated by the gradation of the detection pixels DPX. For example, according to the defect of the first crack detection patterns CDP1, the gradation of the detection pixels DPX may be changed.

The detection pixels DPX may display various gradations. The gradation of the detection pixels DPX shown in FIG. 20 may display a higher gradation towards an upper part from that of a lower part.

When the detection pixels DPX display a gradation larger than a reference gradation Rg, a detection circuit DCC determines a state of the display device DD to be abnormal NG, and when the detection pixels DPX display a gradation less than or equal to the reference gradation Rg, the state of the display device DD may be determined to be normal NR. The reference gradation Rg may have a value larger than the minimum gradation Gmin and smaller than the maximum gradation Gmax. Accordingly, the defect of the display device DD may be more easily detected.

According to one or more embodiments of the present disclosure, the first crack detection pattern is disposed on the display panel, and when viewed on a plane (e.g., in a plan view), the 2-1st and the 2-2nd crack detection patterns may be disposed at (e.g., in or on) the input sensing part to overlap with the first crack pattern. The detection voltage may be transmitted from the 2-1st crack detection pattern to the 2-2nd crack pattern through charge pumping of the capacitors provided by the first crack detection pattern and the 2-1st and 2-2nd crack detection patterns.

The detection voltage may be provided to the detection pixels connected to the 2-2nd crack detection pattern to be turned off, so that the detection pixels display black. When the first crack detection pattern is defected, a voltage level provided to the detection pixels becomes low to cause the detection pixels to emit light, and thus, the crack of the hole may be more easily detected.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a plurality of pixels at a display area around a transmissive area;
   a first crack detection pattern at the transmissive area;
   a 2-1st crack detection pattern on the first crack detection pattern; and
   a 2-2nd crack detection pattern on the first crack detection pattern, the 2-2nd crack detection pattern being spaced from the 2-1st crack detection pattern, and adjacent to the 2-1st crack detection pattern,
   wherein, in a plan view, the first crack detection pattern overlaps with the 2-1st and 2-2nd crack detection patterns to form a capacitance therebetween.

2. The display device according to claim 1, wherein a hole in the transmissive area is defined, in which at least one of a camera or a sensor is to be located, and in a plan view, the first crack detection pattern is defined as a closed curve surrounding the hole.

3. The display device according to claim 2, wherein in a plan view, the 2-1st and 2-2nd crack detection patterns surround the hole.

4. The display device according to claim 1, wherein the plurality of pixels comprises:
a first pixel connected to the 2-1st crack detection pattern; and
a second pixel connected to the 2-2nd crack detection pattern.

5. The display device according to claim 4, further comprising:
a first crack detection line configured to connect the first pixel and the 2-1st crack detection pattern to each other;
a second crack detection line configured to connect the second pixel and the 2- 2nd crack detection pattern to each other; and
a first data line and a second data line connected to the first pixel and the second pixel, respectively.

6. The display device according to claim 5, further comprising:
a 1-1st switching element connected between the first crack detection line and the first data line, and configured to be switched by a first control signal; and
a 1-2nd switching element connected between the second crack detection line and the second data line, and configured to be switched by the first control signal.

7. The display device according to claim 6, further comprising:
a data driver; and
a plurality of second switching elements connected between the data driver and the first and second data lines, and configured to be switched by a second control signal.

8. The display device according to claim 7, wherein, in a display mode, the 1-1st and 1-2nd switching elements are configured to be turned off, and the second switching elements are configured to be turned on.

9. The display device according to claim 7, wherein, in a crack detection mode, the 1-1st and 1-2nd switching elements are configured to be turned on, and the second switching elements are configured to be turned off.

10. The display device according to claim 9, wherein, in the crack detection mode, the first crack detection line is configured to be applied with a detection voltage for turning off the first and second pixels.

11. The display device according to claim 10, wherein the detection voltage is configured to be transmitted from the 2-1st crack detection pattern to the 2-2nd crack detection pattern by charge pumping of capacitors between the first crack detection pattern and the 2-1st and 2-2nd crack detection patterns.

12. The display device according to claim 7, wherein, in an initialization mode before a crack detection mode, the 1-1st and 1-2nd switching elements and the second switching elements are configured to be turned on.

13. The display device according to claim 12, wherein, in the initialization mode, an initialization voltage is configured to be applied to the 2-1st crack detection pattern through the first crack detection line, and the initialization voltage is configured to be output from the data driver and applied to the 2-2nd crack detection pattern through the second crack detection line.

14. The display device according to claim 1, wherein the first crack detection pattern comprises a plurality of first crack detection patterns.

15. The display device according to claim 1, further comprising:
a first conductive pattern on the pixels and around the transmissive area, the first conductive pattern comprising a plurality of sensing parts; and
a second conductive pattern underneath the first conductive pattern, and configured to connect some sensing parts among the sensing parts to each other, wherein each of the 2-1st and 2-2nd crack detection patterns is located at a same layer as that of the first conductive pattern.

16. The display device according to claim 15, wherein each of the 2-1st and 2-2nd crack detection patterns is further located at a same layer as that of the second conductive pattern.

17. The display device according to claim 1, further comprising:
a first crack detection line connected to the 2-1st crack detection pattern;
a second crack detection line connected to the 2-2nd crack detection pattern;
a detection data line connected to a detection pixel from among the pixels;
a first switching element connected between the second crack detection line and the detection data line, and configured to be switched by a first control signal;
a data driver; and
a second switching element connected between the data driver and the detection data line, and configured to be switched by a second control signal.

18. The display device according to claim 17, wherein, in a crack detection mode, the first switching element is configured to be turned on, the second switching element is configured to be turned off, and a detection voltage is configured to be applied to the detection pixel through the 2-1st and 2-2nd crack detection patterns.

19. The display device according to claim 18, further comprising:
a detection circuit configured to determine that a crack is generated in a hole in the transmissive area when the detection pixel displays a gradation larger than a reference gradation, the reference gradation being larger than a minimum gradation and smaller than a maximum gradation.

20. A display device comprising:
a plurality of pixels at a display area around a transmissive area;
a first crack detection pattern at the transmissive area;
a 2-1st crack detection pattern on the first crack detection pattern;
a 2-2nd crack detection pattern on the first crack detection pattern, the 2-2nd crack detection pattern being spaced from the 2-1st crack detection pattern, and adjacent to the 2-1st crack detection pattern;
a first crack detection line at a non-display area around the display area, and connected to the 2-1st crack detection pattern; and
a second crack detection line at the non-display area, and connected to the 2-2nd crack detection pattern.

* * * * *